(12) United States Patent
Kim et al.

(10) Patent No.: US 8,325,849 B2
(45) Date of Patent: Dec. 4, 2012

(54) TRANSMITTING SYSTEM AND METHOD OF PROCESSING BROADCAST DATA IN THE TRANSMITTING SYSTEM

(75) Inventors: Jong Moon Kim, Gyeonggi-do (KR); In Hwan Choi, Gyeonggi-do (KR); Byoung Gill Kim, Seoul (KR); Won Gyu Song, Seoul (KR); Jin Woo Kim, Seoul (KR); Hyoung Gon Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/282,374

(22) Filed: Oct. 26, 2011

(65) Prior Publication Data

US 2012/0038832 A1 Feb. 16, 2012

Related U.S. Application Data

(63) Continuation of application No. 12/831,848, filed on Jul. 7, 2010, now Pat. No. 8,081,713, which is a continuation of application No. 11/774,520, filed on Jul. 6, 2007, now Pat. No. 7,813,445.

(60) Provisional application No. 60/884,203, filed on Jan. 9, 2007.

(30) Foreign Application Priority Data

Jul. 7, 2006 (KR) .................. 10-2006-0063877
Sep. 15, 2006 (KR) .................. 10-2006-0089736

(51) Int. Cl.
*H04L 27/00* (2006.01)
*H04N 5/38* (2006.01)

(52) U.S. Cl. ....................... 375/295; 348/723

(58) Field of Classification Search ............. 375/240.18, 375/240.24, 260, 295–296, 265, 321, 340, 375/341, 350; 714/755, 776, E11.001; 348/14.02, 348/21, 607, 723, 725–726, 729, E05.096; 370/485–487

See application file for complete search history.

(56) References Cited

U.S. PATENT DOCUMENTS 5,757,416 A  5/1998  Birch et al.
(Continued)

FOREIGN PATENT DOCUMENTS

EP  1555826  7/2005
(Continued)

OTHER PUBLICATIONS

Sgrignoli, G., "Preliminary DTV Field Test Results and Their Effects on VSB Receiver Design," IEEE Transactions on Consumer Electronics, vol. 45, No. 3, pp. 894-915, Aug. 1999.
(Continued)

*Primary Examiner* — Lawrence B Williams
(74) *Attorney, Agent, or Firm* — Lee, Hong, Degerman, Kang & Waimey

(57) ABSTRACT

A method of processing broadcast data in a broadcast transmitting system includes Reed-Solomon (RS) encoding and cyclic redundancy check (CRC) encoding enhanced data bytes; converting the RS-CRC encoded enhanced data bytes into enhanced data bits; encoding each of the converted enhanced data bits with one of a first coding rate and a second coding rate, thereby outputting data symbols; first interleaving the data symbols; converting the first interleaved data symbols into data bytes; forming a first data group including enhanced data corresponding to the converted data bytes; deinterleaving data of the first data group; outputting enhanced data packets including the deinterleaved data of the first data group; multiplexing the enhanced data packets with main data packets including main data; second interleaving data of the multiplexed data packets; and trellis encoding the second interleaved data.

10 Claims, 13 Drawing Sheets

U.S. PATENT DOCUMENTS

| | | |
|---|---|---|
| 6,980,603 B2 | 12/2005 | Choi et al. |
| 7,751,446 B2 | 7/2010 | Lee et al. |
| 2002/0154709 A1 * | 10/2002 | Choi et al. .................... 375/301 |
| 2004/0100588 A1 | 5/2004 | Hartson et al. |
| 2005/0141606 A1 | 6/2005 | Choi et al. |
| 2005/0152446 A1 | 7/2005 | Choi et al. |
| 2006/0203127 A1 | 9/2006 | Choi et al. |
| 2007/0211769 A1 * | 9/2007 | Lee et al. ....................... 370/535 |
| 2008/0152035 A1 | 6/2008 | Lee et al. |
| 2009/0037794 A1 | 2/2009 | Choi et al. |
| 2009/0262799 A1 | 10/2009 | Limberg |
| 2010/0118206 A1 | 5/2010 | Gao et al. |

FOREIGN PATENT DOCUMENTS

| | | |
|---|---|---|
| WO | 2005/006759 | 1/2005 |
| WO | WO 2005006759 A1 * | 1/2005 |
| WO | 2005/115001 | 12/2005 |
| WO | WO 2005115001 A1 * | 12/2005 |

OTHER PUBLICATIONS

Bretl et al., "E-VSV—An 8-VSB Compatible System With Improved White Noise and Multipath Performance," IEEE Transactions on Consumer Electronics, vol. 47, No. 3, pp. 307-312, Aug. 2001.

* cited by examiner

TRANSMITTING SYSTEM AND METHOD OF PROCESSING BROADCAST DATA IN THE TRANSMITTING SYSTEM

This application is a continuation of U.S. patent application Ser. No. 12/831,848, filed Jul. 7, 2010, now U.S. Pat. No. 8,081,713 B2, which is a continuation of U.S. patent application Ser. No. 11/774,520, filed Jul. 6, 2007, now U.S. Pat. No. 7,813,445, which claims the benefit of earlier filing date and right of priority to Korean Patent Application No. 10-2006-0063877, filed on Jul. 7, 2006, and Korean Patent Application No. 10-2006-0089736, filed on Sep. 15, 2006, and also claims the benefit of U.S. Provisional Application Ser. No. 60/884,203, filed on Jan. 9, 2007, the contents of which are all hereby incorporated by reference in their entirety.

BACKGROUND OF THE INVENTION

1. Field of the Invention

The present invention relates to digital television (DTV) systems and methods of processing DTV signals.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receivers.

SUMMARY OF THE INVENTION

Accordingly, the present invention is directed to DTV systems and methods of processing signals that substantially obviate one or more problems due to limitations and disadvantages of the related art.

An object of the present invention is to provide DTV systems and methods of processing signals that are highly resistant to channel changes and noise.

Another object of the present invention is to provide DTV systems and methods of processing signals that can also enhance the receiving performance of a digital broadcast receiving system by using pre-defined known data already known by the receiving system and the transmitting system in demodulation and channel equalization processes.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) receiving system includes an information detector, a timing recovery unit, a carrier recovery unit, and a phase compensation unit. The information detector detects position information of a known data sequence which is periodically repeated in a digital television (DTV) signal and estimates an initial frequency offset value from the DTV signal. The timing recovery unit performs timing recovery on the DTV signal by detecting timing error information from the DTV signal using the position information of the known data sequence. The carrier recovery unit performs carrier recovery on the DTV signal by estimating a frequency offset value of the DTV signal using the position information of the known data sequence. The phase compensation unit compensates a phase offset of the DTV signal using the position information of the known data sequence.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather forecast, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. More specifically, in a digital broadcast transmitting system for multiplexing main data with enhanced data having information included therein known data having a pattern formed in accordance with a pre-arrangement between the receiving system and the transmitting system may also be multiplexed and transmitted in order to enhance the receiving performance. The present invention relates to enhancing the receiving performance of the receiving system by detecting known data transmitted from the transmitting system and using the detected known data in the demodulation process.

Figure 1:
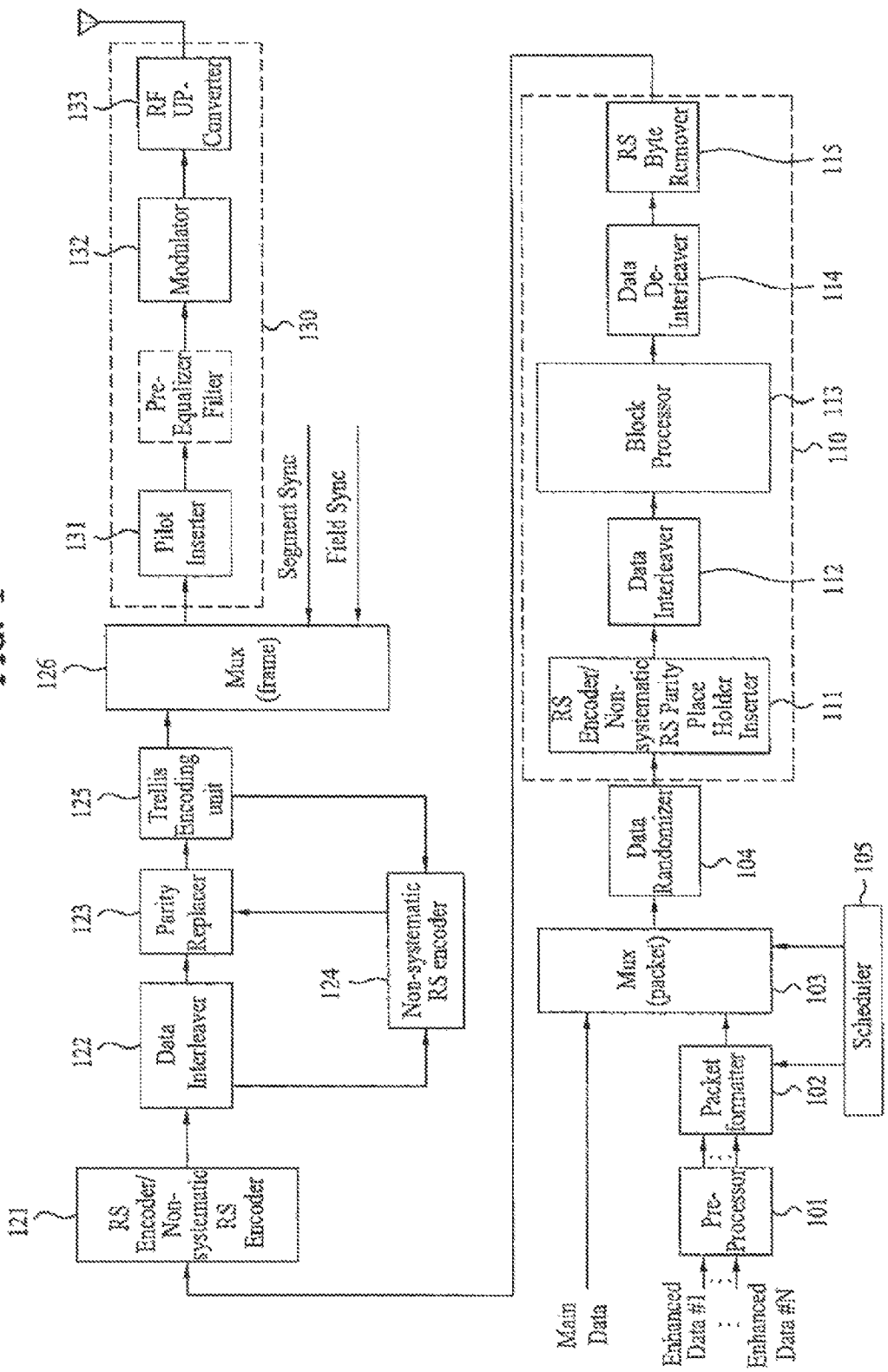
FIG. 1 illustrates a block diagram of a digital broadcast transmitting system according to an embodiment of the present invention.

FIG. 1 illustrates an example of a digital broadcast transmitting system according to the present invention for transmitting known data. The digital broadcast transmitting system of FIG. 1 is merely an example proposed to facilitate the understanding of the present invention. Herein, any transmitting system that can transmit known data sequences may be adopted in the present invention. Therefore, the present invention is not limited to the example proposed in the description set forth herein.

The digital broadcast transmitting system of FIG. 1 includes a pre-processor 101, a packet formatter 102, a packet multiplexer 103, a data randomizer 104, a RS encoder/non-systematic RS encoder 121, a data interleaver 122, a parity replacer 123, a non-systematic RS encoder 124, a trellis-encoding module 125, a frame multiplexer 126, and a transmitting unit 130. In the digital broadcast transmitting system having the above-described structure, the pre-processor 101 receives and pre-processes the enhanced data by performing pre-processes, such as additional block encoding, block interleaving, and byte-expansion by inserting null data. Then, the pre-processed enhanced data are outputted to the packet formatter 102.

At this point, when the inputted enhanced data correspond to different types of enhanced data, for example, when the inputted enhanced data correspond to high priority data and low priority data, the pre-processor 101 individually performs pre-processes such as additional block encoding, block interleaving, and byte-expansion. Thereafter, the enhanced data, which are identified in accordance with the importance (or priority) of the corresponding data, maintain the identified state and are then outputted to the packet formatter 102. Furthermore, pre-processes, such as additional block encoding, block interleaving, and byte-expansion, may also be identically performed on all enhanced data, thereby being outputted to the packet formatter 102.

Based upon the control of the scheduler 105, the packet formatter 102 adds a 4-byte MPEG header to the pre-processed enhanced data, thereby configuring a 188-byte enhanced data packet. At this point, the enhanced data packet may be configured of enhanced data only, or configured of known data (or known data place holder) only, or configured of enhanced data multiplexed with known data. The output of the packet formatter 102 is inputted to the packet multiplexer 103. Based on the control of the scheduler 105, the packet multiplexer 103 multiplexes the main data packet and the enhanced data packet in packet units and outputs the multiplexed packet to the data randomizer 104.

The scheduler 105 controls the packet formatter 102 and the packet multiplexer 103 so that the interleaved data are formed into a data group divided into a plurality of hierarchical areas in a later process. The scheduler 105 also controls the insertion of the MPEG header and known data (or known data place holders) into the enhanced data packet. More specifically, the scheduler 105 also controls the insertion position of the known data (or known data place holders) so as to enable the known data sequences periodically inserted in the transmission data frame from the receiving system to be received. Furthermore, when required, the scheduler 105 may also control the insertion position of the known data (or known data place holders) so as to enable the known data sequences non-periodically inserted in the transmission data frame from the receiving system to be received.

Figure 2:
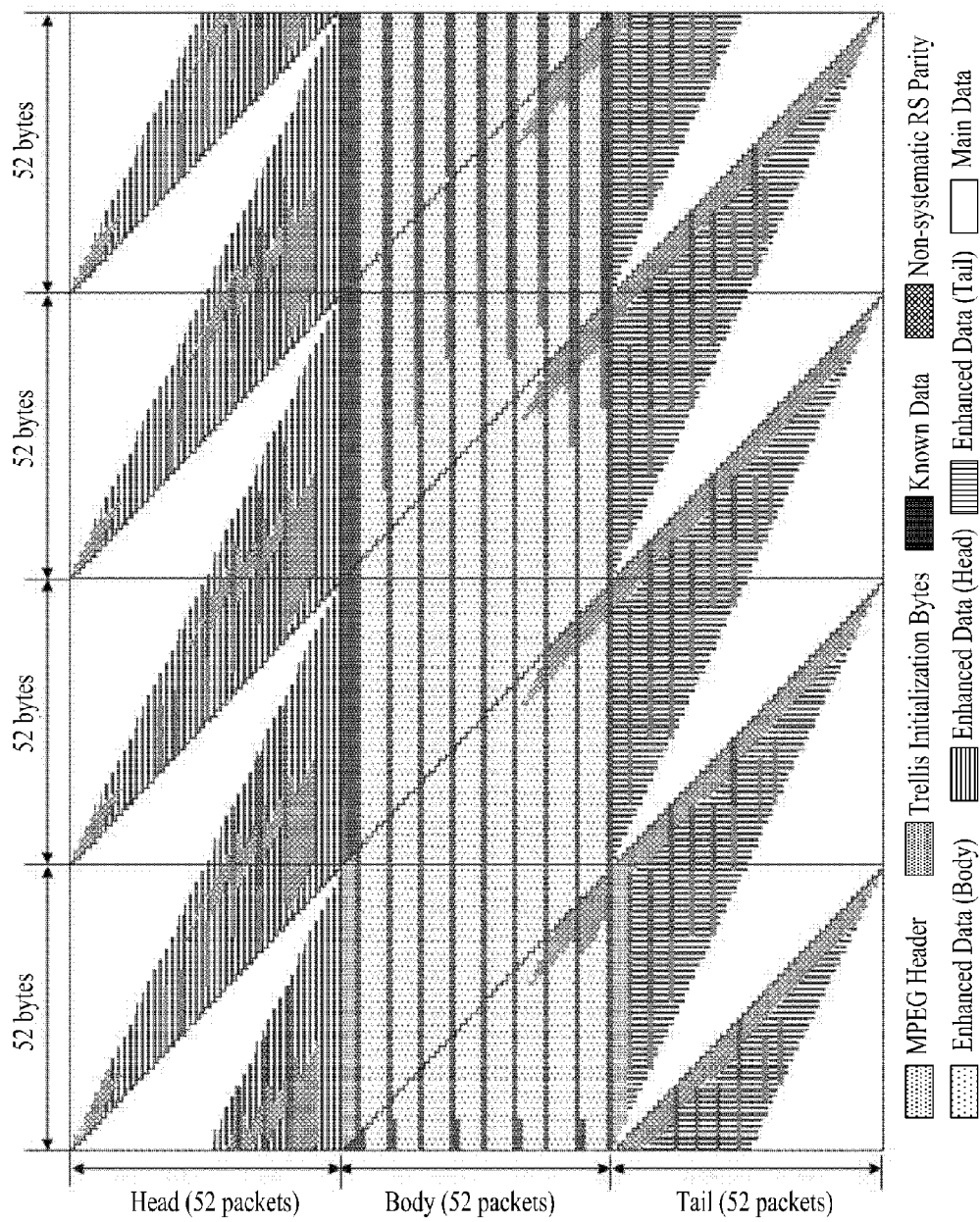
FIG. 2 illustrates a structure of a data group according to an embodiment of the present invention.

FIG. 2 illustrates an example of a data frame structure configured based upon the control of the scheduler 105. Most particularly, FIG. 2 illustrates an example of dividing the data groups into head, body, and tail areas based upon the output of the data interleaver in a later process. Referring to FIG. 2, the head, body, and tail areas are each divided in 52-packet units. However, this is merely exemplary. The number of packets included in the head, body, and tail areas may be altered and varied by the system designer. Therefore, the present invention will not be limited to the above-described example.

In addition, with respect to the output of the data interleaver, the body area is allocated to include at least a portion or the entire area in which enhanced data are consecutively outputted. In the body area, the known data are periodically inserted at a constant rate. The head area is located before the body area, and the tail area is located after the body area. For example, referring to FIG. 2, the main data are not included in the body area, and the known data are inserted after each 6-packet (or segment) cycle. Furthermore, the known data are additionally inserted at the beginning of the body area. In this case, the body area may show a stronger receiving performance, since there is no interference from the main data. The enhanced data of the head and tail areas are mixed with the main data in accordance with the output order from the interleaver. Accordingly, the receiving performance in the head and tail areas is more deteriorated than in the body area.

The output data of the packet multiplexer 103 are inputted to the data randomizer 104. The data randomizer 104 discards (or deletes) the MPEG synchronization byte and randomizes the remaining 187 bytes by using a pseudo-random byte, which is generated from inside the data randomizer 104. Thereafter, the randomized data are outputted to a post-processor 110. Herein, the post-processor 110 includes a Reed-Solomon (RS) encoder/non-systematic RS parity place holder inserter 111, a data interleaver 112, a block processor 113, a data deinterleaver 114, and a RS byte remover 115. The RS encoder/non-systematic RS parity place holder inserter 111 of the post-processor 110 processes the randomized data with a systematic RS-coding process, when the randomized data correspond to the main data packet. Alternatively, the RS encoder/non-systematic RS parity place holder inserter 111 processes the randomized data with a non-systematic RS parity place holder insertion process, when the randomized data correspond to the enhanced data packet. More specifically, if the randomized 187-byte data packet corresponds to the main data packet, the randomized 187-byte data packet being outputted from the data randomizer 104, a systematic RS encoding process is performed as in the conventional system so as to add a 20-byte parity at the end of the 187-byte data. Then, the processed data are outputted to the data interleaver 112. On the other hand, if the randomized 187-byte data packet corresponds to the enhanced data packet, the randomized 187-byte data packet being outputted from the data randomizer 104, in order to perform the non-systematic RS encoding process, a non-systematic RS parity place holder configured of 20 null data byte is inserted in the randomized data packet. Also, data bytes within the enhanced data packet are inserted in each place of the remaining 187 data bytes. Thereafter, the processed data are outputted to the data interleaver 112.

The data interleaver 112 performs a data interleaving process on the output of the RS encoder/non-systematic RS parity place holder inserter 111 and, then, outputs the interleaved data to the block processor 113. The block processor 113 performs additional encoding in block units only on the enhanced data that are outputted from the data interleaver 112 and outputs the additionally encoded enhanced data to the data deinterleaver 114. The data deinterleaver 114 performs an inverse process of the data interleaver 112 by deinterleaving the inputted data and outputs the deinterleaved data to the RS byte remover 115.

The RS byte remover 115 removes the 20-byte parity data, which were inserted by the RS encoder/non-systematic RS parity place holder inserter 111. If the inputted data correspond to the main data packet, the last 20 bytes are removed from the total 207 data bytes. And, if the inputted data correspond to the enhanced data packet, the 20 bytes of the parity place holders that were inserted to perform the non-systematic RS-encoding process are removed from the total 207 data bytes. This is to recalculate the parity, since the initial data have been modified by the block processor 113 in case of the enhanced data. The output of the RS byte remover 115 is then inputted to the RS encoder/non-systematic RS encoder 121.

The RS encoder/non-systematic RS encoder 121 adds 20-byte parity data to the 187-byte packet outputted from the RS byte remover 115. Then, the processed data packet is outputted to the data interleaver 122. At this point, if the inputted data correspond to the main data packet, the RS encoder/non-systematic RS encoder 121 performs a systematic RS-encoding process identical to that of the conventional broadcasting system, thereby adding 20 bytes of parity at the end of the 187-byte unit data. Alternatively, if the inputted data correspond to the enhanced data packet, the RS encoder/non-systematic RS encoder 121 decides 20 parity byte places within the data packet. Then, the RS encoder/non-systematic RS encoder 121 performs a non-systematic RS-encoding process in each of the decided parity byte places within the enhanced data packet, thereby inserting the 20-byte RS parity. Herein, the data interleaver 122 corresponds to a byte unit convolutional interleaver. The same interleaving rule of the data interleaver 112 is also applied to the data interleaver 122. The output of the data interleaver 122 is inputted to the parity replacer 123 and the non-systematic RS encoder 124.

Meanwhile, a process of initializing a memory within the trellis encoding module 125 is primarily required in order to decide the output data of the trellis-encoding module 125, which is located after the parity replacer 123, as the known data defined by the receiving system and the transmitting system. At this point, in order to perform initialization, initialization data is required to be generated and to replace the input data of the trellis encoding module 125 so as to perform initialization in accordance with the memory status. Accordingly, the RS parity that is influenced by the replaced initialization data is required to be recalculated in order to replace the RS parity being outputted from the data interleaver 122. Therefore, the non-systematic RS encoder 124 receives a pre-calculated non-systematic RS parity with respect to the enhanced data packet, which includes data that are to be replaced with the initialization data of the memory, from the data interleaver 122. The non-systematic RS encoder 124 also receives initialization data from the trellis encoding module 125. Thereafter, a new non-systematic RS parity is calculated and then outputted to the parity replacer 123.

If the main data packet is inputted, or if the enhanced data packet, which does not include any initialization data that are to be replaced, is inputted, the parity replacer 123 selects the RS parity and data that are outputted from the data interleaver 122, which are then outputted to the trellis encoding module 125. Meanwhile, if the enhanced data packet including initialization data that are to be replaced is inputted, the parity replacer 123 selects the output of the data interleaver 122 for the data and selects the output of the non-systematic RS encoder 124 for the RS parity, which are then outputted to the trellis encoding module 125.

The trellis encoding module 125 converts the byte-unit data to symbol units and performs a 12-way interleaving process so as to trellis-encode the received data. Thereafter, the processed data are outputted to the frame multiplexer 126. The frame multiplexer 126 inserts a field synchronization signal and a segment synchronization signal to the data outputted from the trellis encoding module 125 and, then, outputs the processed data to the transmitting unit 130. Herein, the transmitting unit 130 includes a pilot inserter 131, a modulator 132, and a radio frequency (RF) up-converter 133. The operations and roles of the transmitting unit 130 and its components are identical to those of the conventional transmitter. Therefore, detailed description of the same will be omitted for simplicity.

Figure 3:
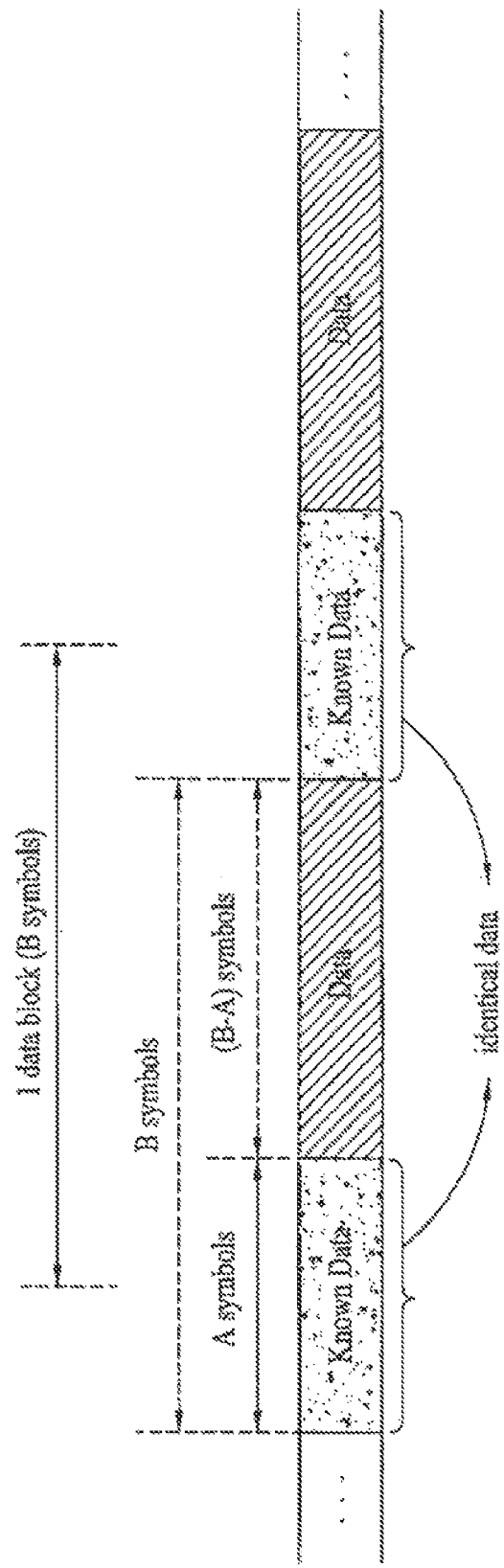
FIG. 3 illustrates an example of known data having identical patterns being periodically inserted according to the present invention.

In transmitting known data, the above-described digital broadcast transmitting system may non-periodically insert known data within a transmission data frame and transmit the processed data. Alternatively, the digital broadcast transmitting system may periodically insert known data within a transmission data frame and transmit the processed data, as shown in FIG. 3. At this point, it is assumed that the known data sequences that are repeated in accordance with a constant cycle period have the same pattern. More specifically, known data sequences having the same pattern may be periodically inserted in the enhanced data packet (or group) and then transmitted. Alternatively, known data sequences having different patterns may be periodically or non-periodically inserted in the enhanced data packet (or group) and then transmitted. Such information may be pre-known by the receiving system or may be transmitted from the transmitting system along with the known data sequence.

FIG. 3 illustrates an example of configuring and transmitting a data structure so that A number of known data symbols are repeated at B number of symbol cycle periods. Referring to FIG. 3, the data indicated as (B-A) symbols may correspond to the enhanced data or to the main data or to a combination of the enhanced data and the main data. In the description of the present invention, the above-described data will be hereinafter referred to as valid data so as to be distinguished from the known data. When known data having the dame pattern are periodically inserted as described above, the receiving system uses the known data as a training sequence, thereby enhancing the receiving performance. For example, the equalizer of the receiving unit may use the above-described known data so as to obtain an accurate decision value. The equalizer may also use the known data in order to estimate a channel impulse response. Furthermore, the demodulating unit within the receiving unit may use the correlation between the known data and the received signal so as to perform carrier recovery and timing clock recovery processes with stability.

Figure 4:
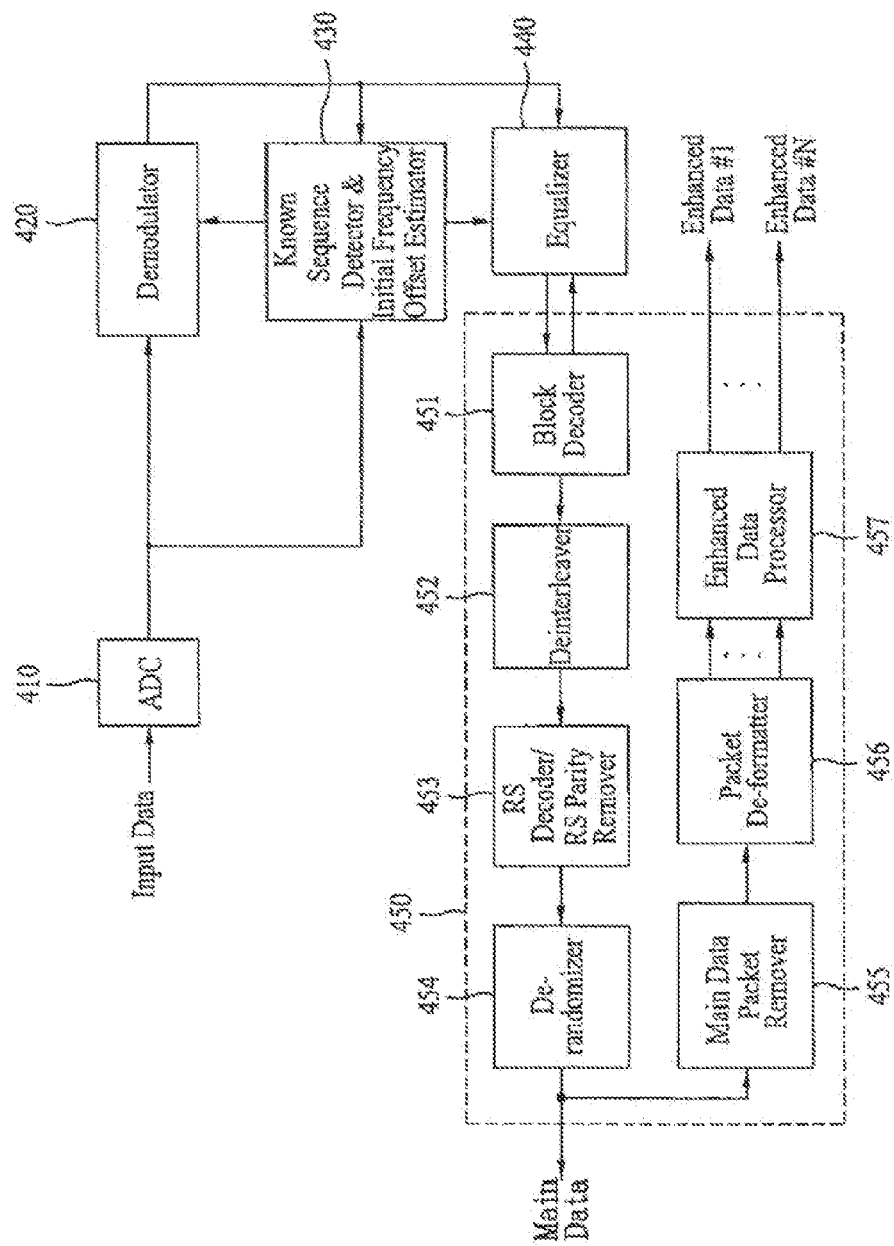
FIG. 4 illustrates a block diagram of a demodulating unit of a digital broadcast receiving system according to an embodiment of the present invention.

FIG. 4 illustrates an example of a demodulating unit of the digital broadcast receiving system according to the present invention. Referring to FIG. 4, the digital broadcast receiving system includes an analog/digital converter (ADC) 410, a demodulator 420, a known data detector and initial frequency offset estimator 430, an equalizer 440, and an error correction unit 450. Herein, the error correction unit 450 includes a block decoder 451, a data deinterleaver 452, a RS decoder/non-systematic RS parity remover 453, a derandomizer 454, a main data packet remover 455, a packet deformatter 456, and an enhanced data processor 457. More specifically, a signal of a particular channel tuned by a tuner is inputted to the ND converter 410 in the form of an analog signal. The ND converter 410 digitalizes the analog signal of the particular channel and outputs the digitalized signal to the demodulator 420. The demodulator 420 performs carrier recovery and timing recovery processes on digitalized pass band signals, so as to change the digitalized pass band signals to baseband signals. Thereafter, the baseband signals are outputted to the known data detector and initial frequency offset estimator 430 and the equalizer 440.

The known data detector and initial frequency offset estimator 430 estimates known data place information (or a known sequence position indicator), known data sequences corresponding to the place information, and an initial frequency offset, which have been inserted by the transmitting system, from the input/output data of the demodulator 420 (i.e., the data prior to demodulation or the data after demodulation). Thereafter, the estimated data are outputted to the demodulator 420 and the equalizer 440. Accordingly, the demodulator 420 uses the known data symbol sequence during the timing and/or carrier recovery, thereby enhancing the demodulating performance. Similarly, the channel equalizer 440 uses the known data, thereby enhancing the equalizing performance. Detailed description of the timing recovery and carrier recovery of the demodulator 420 using the known data will be given in a later process.

Furthermore, the equalizer 440 compensates the distortion included in the demodulated signal and occurring within the channel. Then, the compensated data are outputted to the block decoder 451 of the error correction unit 450. At this point, the equalizer 440 uses the known data information to enhance the equalization performance. Furthermore, the equalizer 440 may use an 8-level decision value decided from the block decoder 451, thereby enhancing the equalization performance.

Meanwhile, the data that are inputted to the block decoder 451 from the equalizer 440 correspond to the main data that are only processed with trellis encoding by the trellis encoding module and not processed with additional encoding by the block processor of the transmitting system, or to the known data, or to the enhanced data that are processed with both additional encoding and trellis-encoding by the transmitting system, the block decoder 604 performs trellis decoding and additional decoding processes as inverse processes of the transmitting system. If the data that are inputted to the block decoder 451 correspond to the main data or the known data, the block decoder 451 may either perform Viterbi decoding on the inputted data or may hard decide a corresponding soft decision value and output the hard-decided result. Furthermore, since the transmitting system considers the RS parity byte and the MPEG header byte, both added to the enhanced data packet from the transmitting system, as the main data, additional encoding is not processed on the RS parity byte and MPEG header byte. Similarly, the block decoder 451 may either perform Viterbi decoding on the RS parity byte and MPEG header byte or may hard decide a corresponding soft decision value and output the hard-decided result.

Alternatively, if the inputted data correspond to the enhanced data, the block decoder 451 may output either a hard decision value or a soft decision value on the inputted enhanced data. If the block decoder 451 outputs the soft decision value, the performance of an additional error correction decoding process, which is performed on the enhanced data by the enhanced data processor 457 in a later process, may be enhanced. Hereinafter, an example of the block decoder 451 outputting a soft decision value with respect to the enhanced data will now be described.

The output of the block decoder 451 is inputted to the data deinterleaver 452. The data deinterleaver 452 performs an inverse process of the data interleaver included in the transmitting system and outputs the deinterleaved data to the RS decoder/non-systematic RS parity remover 453. When the inputted data packet corresponds to a main data packet, the RS decoder/non-systematic RS parity remover 453 performs a systematic RS decoding process. Alternatively, when the inputted data packet corresponds to an enhanced data packet, the RS decoder/non-systematic RS parity remover 453 removes the non-systematic RS parity byte that has been inputted to the data packet in an earlier process. Thereafter, the RS decoder/non-systematic RS parity remover 453 outputs the processed data to the derandomizer 454.

The derandomizer 454 receives the data outputted from the RS decoder/non-systematic RS parity remover 453 and generates a pseudo random data byte identical to that of the randomizer included in the digital broadcast transmitting system (or DTV transmitter). Thereafter, the derandomizer 454 performs a bitwise exclusive OR (XOR) operation between the generated pseudo random data byte and the data packet outputted from the RS decoder/non-systematic RS parity remover 453, thereby inserting the MPEG synchronization bytes to the beginning of each packet so as to output the data in 188-byte data packet units. The output of the derandomizer 454 is inputted to a main MPEG decoder (not shown) and to the main data packet remover 455 at the same time. The main MPEG decoder performs decoding only on the data packet corresponding to the main MPEG. Herein, since the enhanced data packet includes a null PID or a reserved PID, which is not used by the conventional receiving system, the enhanced data packet is not used by the main MPEG decoder for decoding and, therefore, disregarded.

However, it is difficult to perform a bitwise exclusive OR (XOR) operation between the soft decision value of the enhanced data and the pseudo random bit. Therefore, as described above, depending upon the code of the soft decision value, a hard decision is performed on the data that ate to be outputted to the main MPEG decoder. Then, an XOR operation is performed between the pseudo random bit and the hard decided data, which are then outputted. More specifically, if the code of the soft decision value is a positive number, the hard decision value is equal to '1'. And, if the code of the soft decision value is a negative number, the hard decision value is equal to '0'. Thereafter, an XOR operation is performed between the pseudo random bit and any one of the hard decided values.

As described above, a soft decision is required in the enhanced data processor 457 in order to enhance the performance when decoding the error correction code. Therefore, the derandomizer 454 creates a separate output data with respect to the enhanced data, which is then outputted to the main data packet remover 455. For example, when the pseudo random bit is equal to '1', the derandomizer 454 changes the code of the soft decision value and then outputs the changed code. On the other hand, if the pseudo random bit is equal to '0', the derandomizer 454 outputs the soft decision value without any change in the code.

As described above, if the pseudo random bit is equal to '1', the code of the soft decision value is changed because, when an XOR operation is performed between the pseudo random bit and the input data in the randomizer of the transmitting system, and when the pseudo random bit is equal to '1', the code of the output data bit becomes the opposite of the input data (i.e., 0 XOR 1=1 and 1 XOR 0=0). More specifically, if the pseudo random bit generated from the derandomizer 454 is equal to '1', and when an XOR operation is performed on the hard decision value of the enhanced data bit, the XOR-operated value becomes the opposite value of the hard decision value. Therefore, when the soft decision value is outputted, a code opposite to that of the soft decision value is outputted.

The main data packet remover 455 acquires only the soft decision value of the enhanced data from the output of the derandomizer 454. Then, the main data packet remover 455 outputs the acquired soft decision value. More specifically, the main data packet remover 455 removes the 188-byte unit main data packet from the output of the derandomizer 454 and acquires only the soft decision value of the enhanced data packet, thereby outputting the processed data packet to the packet deformatter 456. The packet deformatter 456 first removes the MPEG header so as to obtain a 184-byte unit data packet. Herein, the MPEG header includes a PID for the enhanced data, which was inserted from the transmitting system in order to distinguish the enhanced data from the main data packet in an earlier process. Thereafter, the 184-byte packet is grouped to create a data group having a pre-determined size. Subsequently, the packet deformatter 456 removes the known data from pre-decided places, the known data having been inserted in an earlier process by the transmitting system for the demodulation and equalization processes. Then, the packet deformatter 456 identifies the enhanced data included in the head, body, and tail areas within the data group and outputs the identified enhanced data to the enhanced data processor 457.

The enhanced data processor 457 performs block deinterleaving and block decoding processes on the soft-decided and outputted enhanced data. More specifically, the enhanced data processor 457 performs the inverse processes of the pre-processor included in the transmitting system. For example, it is assumed that the pre-processor of the transmitting system has separately performed an additional block encoding process, a block interleaving process, and a byte expansion by either adding null bits or by repeating the input bits on the inputted enhanced data depending upon the enhanced data type. Accordingly, the enhanced data processor 457 separately performs the inverse processes of the pre-processor included in the transmitting system on the enhanced data depending upon the enhanced data type. Similarly, the final enhanced data identified based upon the order of importance or priority, in accordance with the same method as in the transmitting system, are then outputted. More specifically, the enhanced data processor 457 processes the enhanced data soft-decided and inputted by removing the null bits or repetition bits that have been inserted by the pre-processor for byte expansion and performing block deinterleaving and block decoding processes in accordance with the enhanced data type. Thereafter, the enhanced data processor 457 outputs the final enhanced data. For example, the final enhanced data are identified as high priority enhanced data and low priority enhanced data and then outputted.

Meanwhile, in the receiving system shown in FIG. 4, a signal position (or place) should first be acknowledged within the transmission data frame in order to allow the transmitted signal to be received with reliability. Therefore, the known data detector and initial frequency offset estimator 430 acquires initial synchronization by using the transmitted known data. The demodulator 420 should compensate relative movements of the transmitting system and the receiving system and a carrier frequency offset and a sampling frequency offset that are generated due to a difference in frequency between a transmission oscillator and a receiving oscillator. Furthermore, the demodulator 420 should also perform carrier recovery and timing clock recovery processes on the received signal and should also remove a pilot tone signal inserted from a baseband during the transmission of the signal, thereby inserting the processed signal to the equalizer 440.

Figure 5:
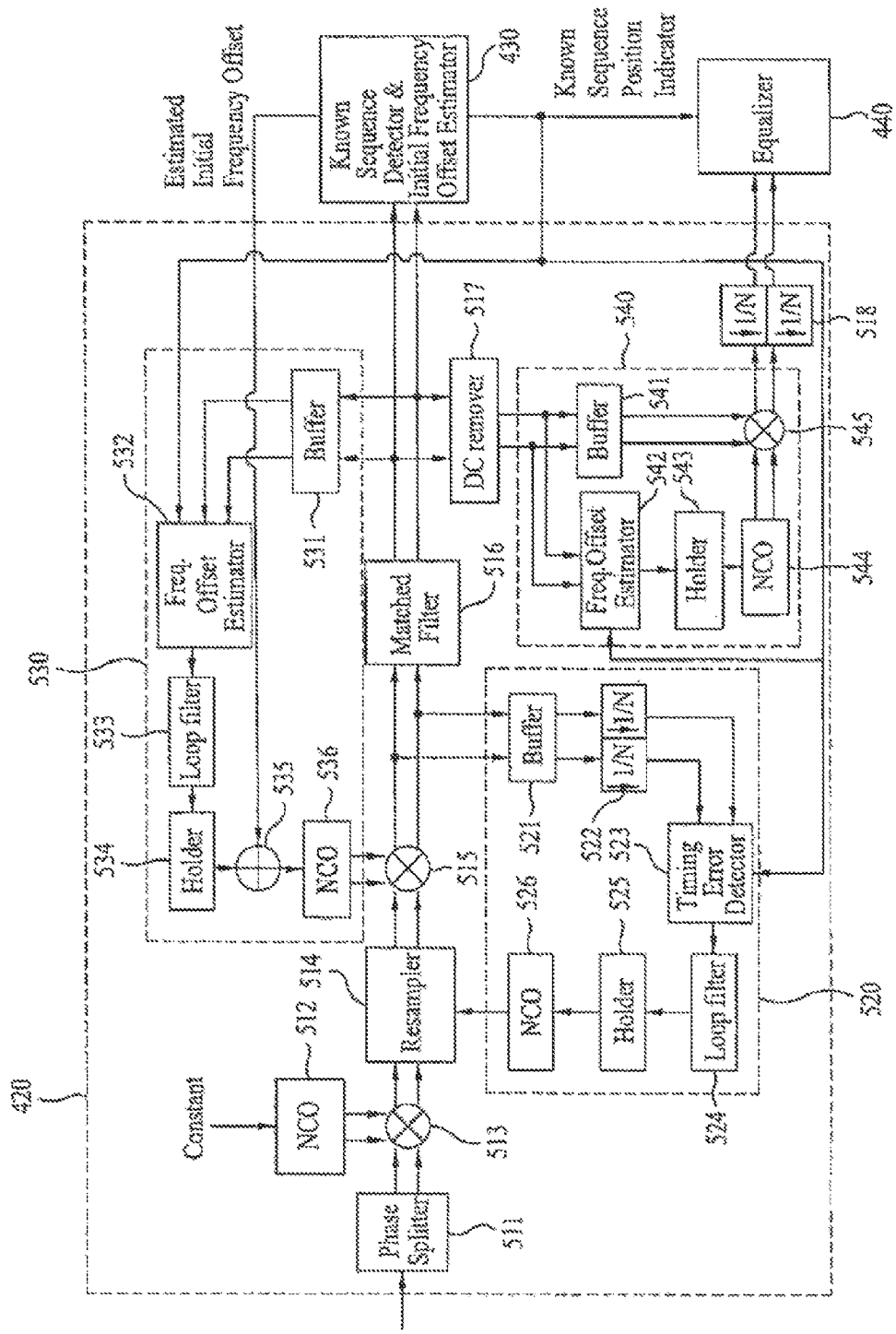
FIG. 5 illustrates a block diagram of a demodulator shown in FIG. 4.

FIG. 5 illustrates a detailed block diagram of a demodulator according to the present invention. Referring to FIG. 5, the demodulator includes a phase splitter 511, a numerically controlled oscillator (NCO) 512, a first multiplier 513, a resampler 514, a second multiplier 515, a matched filter 516, a DC remover 517, a decimator 518, a timing recovery unit 520, a carrier recovery unit 530, and a phase compensator 540. Herein, the timing recovery unit 520 includes a buffer 521, a decimator 522, a timing error detector 523, a loop filter 524, a holder 525, and a NCO 526. The carrier recovery unit 530 includes a buffer 531, a frequency offset estimator 532, a loop filter 533, a holder 534, an adder 535, and a NCO 536.

Finally, the phase compensator 540 includes a buffer 541, a frequency offset estimator 542, a holder 543, a NCO 544, and a multiplier 545.

Herein, the decimator 518 and 522 each corresponds to a component required when a signal being inputted to the phase compensator 540 is oversampled to N times by the ADC 410. More specifically, the integer N represents the sampling rate of the received signal. For example, when the input signal is oversampled to 2 times (i.e., when N=2), this indicates that two samples are included in one symbol. In this case, the decimator 518 and 522 corresponds to a ½ decimator. Depending upon whether or not the oversampling process of the received signal has been performed, the signal may bypass the decimator 518 and 522.

Referring to FIG. 5, the phase splitter 511 splits the pass band digital signal, which is outputted from the ADC 410, into a pass band digital signal of a real number element and a pass band digital signal of an imaginary number element both having a phase of −90 degrees between one another. In other words, the pass band digital signal is split into complex signals. The split portions of the pass band digital signal are then outputted to the first multiplier 513. Herein, the real number signal outputted from the phase splitter 511 will be referred to as an 'I' signal, and the imaginary number signal outputted from the phase splitter 511 will be referred to as a 'Q' signal, for simplicity of the description of the present invention.

The first multiplier 513 multiplies the I and Q pass band digital signals, which are outputted from the phase splitter 511, to a complex signal having a frequency proportional to a constant being outputted from the NCO 512, thereby changing the I and Q pass band digital signals to baseband digital complex signals. Then, the baseband digital signals of the first multiplier 513 are inputted to the resampler 514. The resampler 514 resamples the signals being outputted from the first multiplier 513 so that the signal correspond to the timing clock provided by the NCO 526 of the timing recovery unit 520. Thereafter, the resampler 514 outputs the resampled signals to the second multiplier 515.

For example, when the ADC 410 uses a 25 MHz fixed oscillator, the baseband digital signal having a frequency of 25 MHz, which is created by passing through the ADC 410, the phase splitter 511, and the first multiplier 513, is processed with an interpolation process by the resampler 514. Thus, the interpolated signal is recovered to a baseband digital signal having a frequency twice that of the receiving signal of a symbol clock (i.e., a frequency of 21.524476 MHz). Alternatively, if the ADC 410 uses the sampling frequency as the output frequency of the NCO 526 included in the timing recovery unit 520 (i.e., if the ADC 410 uses a variable frequency) in order to perform an ND conversion process, the resampler 514 is not required and may be omitted.

The second multiplier 515 multiplies an output frequency of the NCO 536 included in the carrier recovery unit 530 with the output of the resampler 514 so as to compensate any remaining carrier included in the output signal of the resampler 514. Thereafter, the compensated carrier is outputted to the matched filter 516 and the timing recovery unit 520. The signal matched-filtered by the matched filter 516 is inputted to the DC remover 517, the known data detector and initial frequency offset estimator 430, and the carrier recovery unit 530.

The known data detector and initial frequency offset estimator 430 detects the place (o position) of the known data sequences that are being periodically or non-periodically transmitted. Simultaneously, the known data detector and initial frequency offset estimator 430 estimates an initial frequency offset during the known data detection process. More specifically, while the transmission data frame is being received, the known data detector and initial frequency offset estimator 430 detects the position (or place) of the known data included in the transmission data frame. Then, the known data detector and initial frequency offset estimator 430 outputs the detected information on the known data place (i.e., a known sequence position indicator) to the timing recovery unit 520, the carrier recovery unit 530, and the phase compensator 540 of the demodulator 420. Furthermore, the known data detector and initial frequency offset estimator 430 estimates the initial frequency offset, which is then outputted to the carrier recovery unit 530. At this point, the known data detector and initial frequency offset estimator 430 may either receive the output of the matched filter 516 or receive the output of the resampler 514. This may be optionally decided depending upon the design of the system designer.

Figure 6:
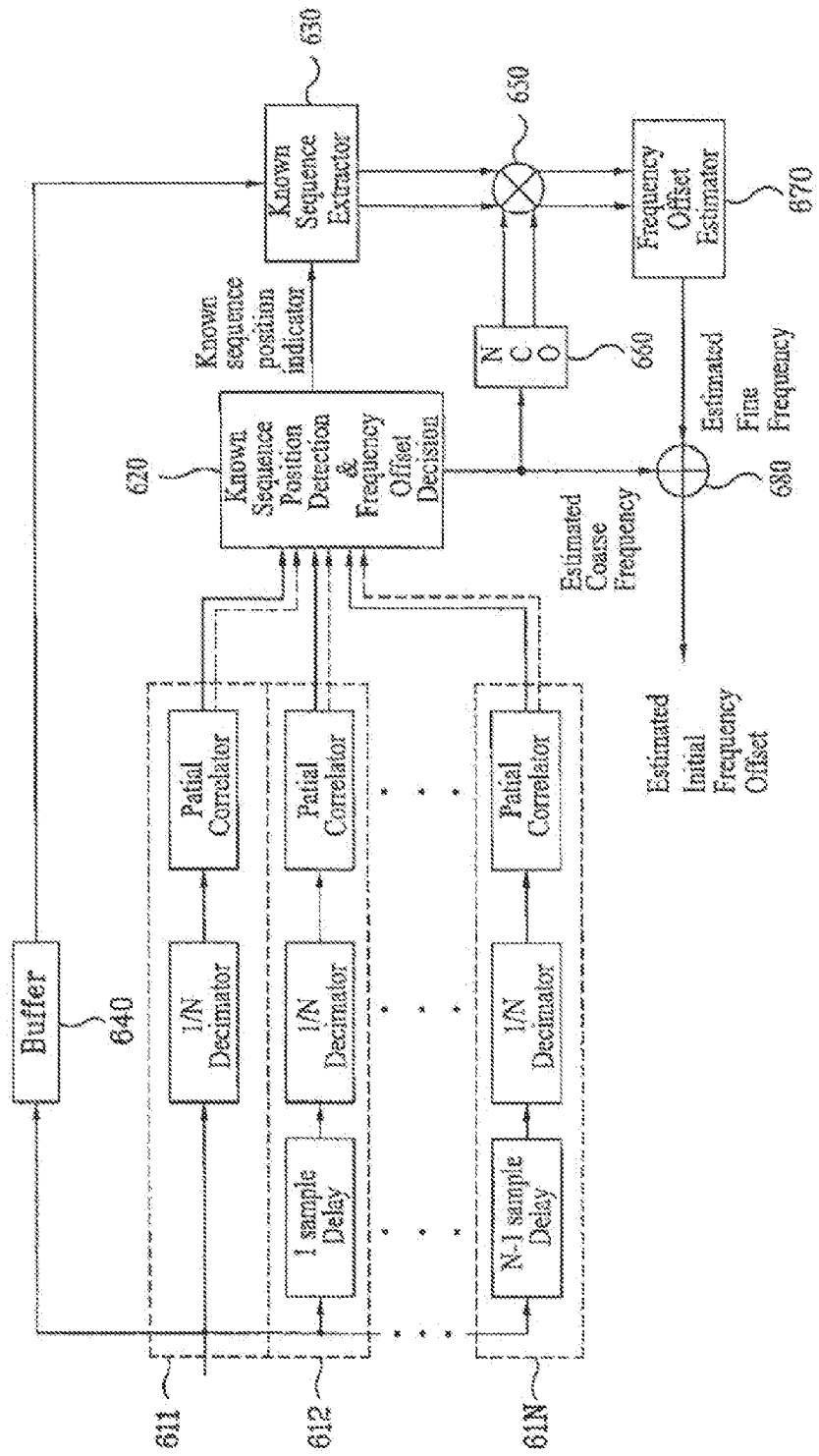
FIG. 6 illustrates a block diagram of a known data detector and initial frequency offset estimator shown in FIG. 4.

FIG. 6 illustrates a detailed block diagram showing a known data (or sequence) detector and generator according to an embodiment of the present invention. More specifically, FIG. 6 illustrates an example of an initial frequency offset being estimated along with the known sequence position indicator. Herein, FIG. 6 shows an example of an inputted signal being oversampled to N times of its initial state. Referring to FIG. 6, the known sequence detector and generator includes N number of partial correlators 611 to 61N configured in parallel, a known data place detector and frequency offset decider 620, a known data extractor 630, a buffer 640, a multiplier 650, a NCO 660, a frequency offset estimator 670, and an adder 680. Herein, the first partial correlator 611 consists of a 1/N decimator, and a partial correlator. The second partial correlator 612 consists of a 1 sample delay, a 1/N decimator, and a partial correlator. And, the $N^{th}$ partial correlator 61N consists of a N−1 sample delay, a 1/N decimator, and a partial correlator. These are used to match (or identify) the phase of each of the samples within the oversampled symbol with the phase of the original (or initial) symbol, and to decimate the samples of the remaining phases, thereby performing partial correlation on each sample. More specifically, the input signal is decimated at a rate of 1/N for each sampling phase, so as to pass through each partial correlator.

For example, when the input signal is oversampled to 2 times (i.e., when N=2), this indicates that two samples are included in one signal. In this case, two partial correlators are required, and each 1/N decimator becomes a ½ decimator. At this point, the 1/N decimator of the first partial correlator 611 decimates (or removes), among the input samples, the samples located in-between symbol places (or positions). Then, the corresponding 1/N decimator outputs the decimated sample to the partial correlator. Furthermore, the 1 sample delay of the second partial correlator 612 delays the input sample by 1 sample (i.e., performs a 1 sample delay on the input sample) and outputs the delayed input sample to the 1/N decimator. Subsequently, among the samples inputted from the 1 sample delay, the 1/N decimator of the second partial correlator 612 decimates (or removes) the samples located in-between symbol places (or positions). Thereafter, the corresponding 1/N decimator outputs the decimated sample to the partial correlator.

After each predetermined period of the symbol, each of the partial correlators outputs a correlation value and an estimation value of the coarse frequency offset estimated at that particular moment to the known data place detector and frequency offset decider 620. The known data place detector and frequency offset decider 620 stores the output of the partial correlators corresponding to each sampling phase during a data group cycle or a pre-decided cycle. Thereafter, the known data place detector and frequency offset decider 820 decides a position (or place) corresponding to the highest correlation value, among the stored values, as the place (or position) for receiving the known data. Simultaneously, the known data place detector and frequency offset decider 620 finally decides the estimation value of the frequency offset estimated at the moment corresponding to the highest correlation value as the coarse frequency offset value of the receiving system. At this point, the known sequence position indicator is inputted to the known data extractor 630, and the estimated coarse frequency offset is inputted to the adder 680 and the NCO 660.

In the meantime, while the N number of partial correlators 611 to 61N detect the known data place (or known sequence position) and estimate the coarse frequency offset, the buffer 640 temporarily stores the received data and outputs the temporarily stored data to the known data extractor 630. The known data extractor 630 uses the known sequence position indicator, which is outputted from the known data place detector and frequency offset decider 620, so as to extract the known data from the output of the buffer 640. Thereafter, the known data extractor 630 outputs the extracted data to the multiplier 650. The NCO 660 generates a complex signal corresponding to the coarse frequency offset being outputted from the known data place detector and frequency offset decider 620. Then, the NCO 660 outputs the generated complex signal to the multiplier 650.

The multiplier 650 multiplies the complex signal of the NCO 660 to the known data being outputted from the known data extractor 630, thereby outputting the known data having the coarse frequency offset compensated to the frequency offset estimator 670. The frequency offset estimator 670 estimates a fine frequency offset from the known data having the coarse frequency offset compensated. Subsequently, the frequency offset estimator 670 outputs the estimated fine frequency offset to the adder 680. The adder 680 adds the coarse frequency offset to the fine frequency offset. Thereafter, the adder 680 decides the added result as a final initial frequency offset, which is then outputted to the adder 535 of the carrier recovery unit 530 included in the demodulator 420. More specifically, during the process of acquiring initial synchronization, the present invention may estimate and use the coarse frequency offset as well as the fine frequency offset, thereby enhancing the estimation performance of the initial frequency offset.

It is assumed that the known data is inserted within the data group and then transmitted, as shown in FIG. 2. Then, the known data detector and initial frequency offset estimator 430 may use the known data that have been additionally inserted at the beginning portion of the body area, so as to estimate the initial frequency offset. The known position indicator, which was periodically inserted within the body area estimated by the known data detector and initial frequency offset estimator 430, is inputted to the timing error detector 523 of the timing error recovery unit 420, to the frequency offset estimator 532 of the carrier recovery unit 530, and to the frequency offset estimator 542 of the phase compensator 540. More specifically, the output of the second multiplier 515 is temporarily stored in the buffer 521 within the timing recovery unit 520. Subsequently, the temporarily stored output data are inputted to the timing error detector 523 through the decimator 522.

Assuming that the output of the second multiplier 515 is oversampled to N times its initial state, the decimator 522 decimates the output of the buffer 521 at a decimation rate of 1/N. Then, the 1/N-decimated data are inputted to the timing error detector 523. In other words, the decimator 522 performs decimation on the input signal in accordance with a symbol cycle. Furthermore, the buffer 521 may also receive the output of the matched filter 516 instead of the output of the second multiplier 515. The timing error detector 523 uses the known sequence position indicator to detect a timing error from the known data sequence prior to or after being processed with matched-filtering, when the known data sequence is being inputted. Thereafter, the detected timing error is outputted to the loop filter 524. Accordingly, the detected timing error information is obtained once during each repetition cycle of the known data sequence. More specifically, for example, if a known data sequence having the same pattern is periodically inserted and transmitted, as shown in FIG. 3, the timing error detector 523 may use the known data in order to detect the timing error.

There exists a plurality of methods for detecting timing error by using the known data. In the example of the present invention, the timing error may be detected by using a correlation characteristic between the known data and the received data in the time domain, the known data being already known in accordance with a pre-arranged agreement between the transmitting system and the receiving system. The timing error may also be detected by using the correlation characteristic of the two known data types being received in the frequency domain. Thus, the detected timing error is outputted. In another example, a spectral lining method may be applied in order to detect the timing error. Herein, the spectral lining method corresponds to a method of detecting timing error by using sidebands of the spectrum included in the received signal.

The loop filter 524 filters the timing error detected by the timing error detector 523 and, then, outputs the filtered timing error to the holder 525. The holder 525 holds (or maintains) the timing error filtered and outputted from the loop filter 524 during a pre-determined known data sequence cycle period and outputs the processed timing error to the NCO 526. The NCO 526 accumulates the timing error outputted from the holder 525. Thereafter, the NCO 526 outputs the phase element of the accumulated timing error to the resampler 514, thereby adjusting the sampling timing of the resampler 514. More specifically, a signal having the correct phase is to be interpolated and outputted from the resampler 514. Herein, the positions of the loop filter 524 and the holder 526 may be switched from one to the other.

Meanwhile, the buffer 531 of the carrier recovery unit 530 may receive either the data inputted to the matched filter 416 or the data outputted from the matched filter 416 and, then, temporarily store the received data. Thereafter, the temporarily stored data are outputted to the frequency offset estimator 532. The frequency offset estimator 532 uses the known sequence position indicator outputted from the known data detector and initial frequency offset estimator 430 in order to estimate the frequency offset from the known data sequence prior to or after matched-filtering, when the known data sequence is being inputted. Then, the estimated frequency offset is outputted to the loop filter 533. Therefore, the estimated frequency offset value is obtained once every repetition period of the known data sequence.

The loop filter 533 performs low pass filtering on the frequency offset value estimated by the frequency offset estimator 532 and outputs the low pass-filtered frequency offset value to the holder 534. The holder 534 holds (or maintains) the low pass-filtered frequency offset value during a pre-determined known data sequence cycle period and outputs the frequency offset value to the adder 535. Herein, the positions of the loop filter 533 and the holder 534 may be switched from one to the other. The adder 535 adds the value of the initial frequency offset estimated by the known data detector and initial frequency offset estimator 430 to the frequency offset value outputted from the holder 534. Thereafter, the added offset value is outputted to the NCO 536.

The NCO 536 generates a complex signal corresponding to the frequency offset outputted from the adder 535, which is then outputted to the second multiplier 515. The second multiplier 515 multiplies the output of the NCO 536 included in the carrier recovery unit 530 to the output of the resampler 514, so as to remove the carrier offset included in the output signal of the resample 514. Meanwhile, the DC remover 517 removes the pilot tone that had been inserted during the transmission process from the matched-filtered signal. Thereafter, the processed signal is outputted to the phase compensator 540.

Figure 7:
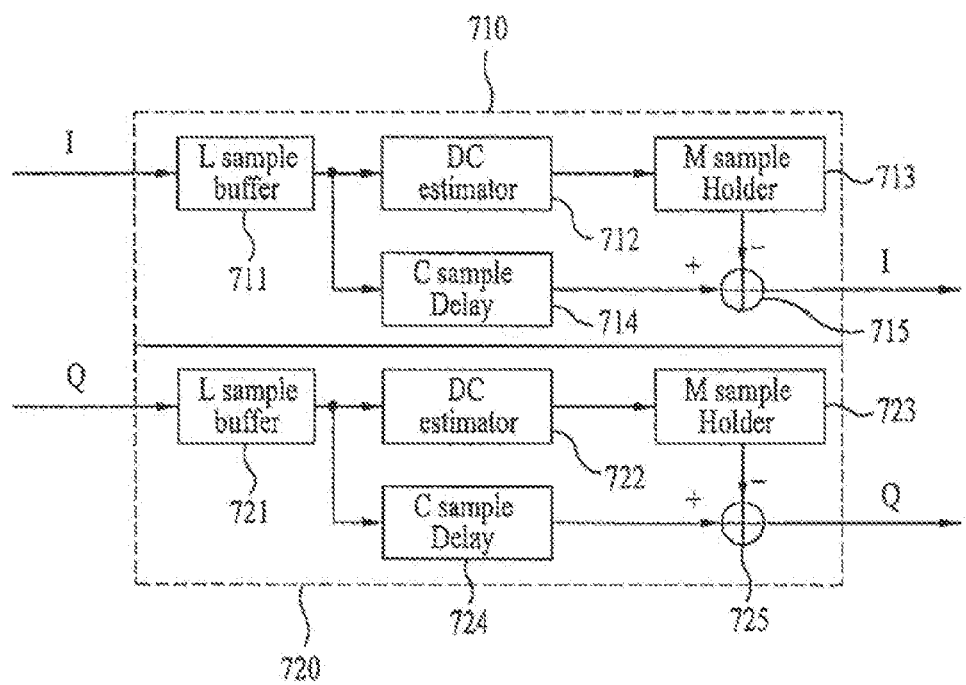
FIG. 7 illustrates a block diagram of a DC remover shown in FIG. 4.

FIG. 7 illustrates a detailed block diagram of a DC remover according to an embodiment of the present invention. Herein, identical signal processing processes are performed on each of a real number element (or in-phase (I)) and an imaginary number element (or a quadrature (Q)) of the inputted complex signal, thereby estimating and removing the DC value of each element. In order to do so, the DC remover shown in FIG. 7 includes a first DC estimator and remover 710 and a second DC estimator and remover 720. Herein, the first DC estimator and remover 710 includes an L sample buffer 711, a DC estimator 712, an M sample holder 713, a C sample delay 714, and a subtractor 715.

The first DC estimator and remover 710 estimates and removes the DC of the real number element (i.e., an in-phase DC). Furthermore, the second DC estimator and remover 720 includes an L sample buffer 721, a DC estimator 722, an M sample holder 723, a C sample delay 724, and a subtractor 725. The second DC estimator and remover 720 estimates and removes the DC of the imaginary number element (i.e., a quadrature DC). In the present invention, the first DC estimator and remover 710 and the second DC estimator and remover 720 may receive different input signals. However, each DC estimator and remover 710 and 720 has the same structure. Therefore, a detailed description of the first DC estimator and remover 710 will be presented herein, and the second DC estimator and remover 720 will be omitted for simplicity.

More specifically, the in-phase signal matched-filtered by the matched filter 516 is inputted to the L sample buffer 711 of the first DC estimator and remover 710 within the DC remover 517 and is then stored. The L sample buffer 711 is a buffer having the length of L sample the second DC estimator and remover 720. Herein, the output of the L sample buffer 711 is inputted to the DC estimator 712 and the C sample delay 714. The DC estimator 712 uses the data having the length of L sample, which are outputted from the buffer 711, so as to estimate the DC value by using Equation 1 shown below.

$$y[n] = \frac{1}{L}\sum_{k=0}^{L-1} x[k + M \times n]$$  Equation 1

In the above-described Equation 1, x[n] represents the inputted sample data stored in the buffer 711. And, y[n] indicates the DC estimation value. More specifically, the DC estimator 712 accumulates L number of sample data stored in the buffer 711 and estimates the DC value by dividing the accumulated value by L. At this point, the stored input sample data set is shifted as much as M sample. Herein, the DC estimation value is outputted once every M samples.

Figure 8:
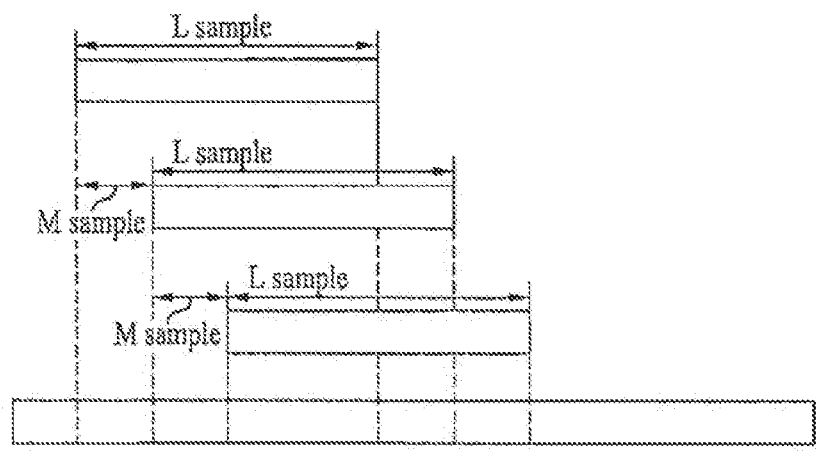
FIG. 8 illustrates an example of relocating sample data inputted to a DC estimator shown in FIG. 7.

FIG. 8 illustrates a shifting of the input sample data used for DC estimation. For example, when M is equal to 1 (i.e., M=1), the DC estimator 712 estimates the DC value each time a sample is shifted to the buffer 711. Accordingly, each estimated result is outputted for each sample. If M is equal to L (i.e., M=L), the DC estimator 712 estimates the DC value each time L number of samples are shifted to the buffer 711. Accordingly, each estimated result is outputted for each cycle of L samples. Therefore, in this case, the DC estimator 712 corresponds to a DC estimator that operates in a block unit of L samples. Herein, any value within the range of 1 and L may correspond to the value M.

As described above, since the output of the DC estimator 712 is outputted after each cycle of M samples, the M sample holder 713 holds the DC value estimated from the DC estimator 712 for a period of M samples. Then, the estimated DC value is outputted to the subtractor 715. Also, the C sample delay 714 delays the input sample data stored in the buffer 711 by C samples, which are then outputted to the subtractor 715. The subtractor 715 subtracts the output of the M sample holder 713 from the output of the C sample delay 714. Thereafter, the subtractor 715 outputs the signal having the in-phase DC removed.

Herein, the C sample delay 714 decides which portion of the input sample data is to be compensated with the output of the DC estimator 712. More specifically, the DC estimator and remover 710 may be divided into a DC estimator 712 for estimating the DC and the subtractor for compensating the input sample data within the estimated DC value. At this point, the C sample delay 714 decides which portion of the input sample data is to be compensated with the estimated DC value. For example, when C is equal to 0 (i.e., C=0), the beginning of the L samples is compensated with the estimated DC value obtained by using L samples. Alternatively, when C is equal to L (i.e., C=L), the end of the L samples is compensated with the estimated DC value obtained by using L samples.

Similarly, the data having the DC removed by the DC remover 517 are inputted to the buffer 541 and the frequency offset estimator 542 of the phase compensator 540. The frequency offset estimator 542 uses the known sequence position indicator outputted from the known data detector and initial frequency offset estimator 430 in order to estimate the frequency offset from the known data sequence that is being inputted, the known data sequence having the DC removed by the DC remover 517. Then, the frequency offset estimator 542 outputs the estimated frequency offset to the holder 543. Similarly, the frequency offset estimation value is obtained at each repetition cycle of the known data sequence.

Therefore, the holder 543 holds the frequency offset estimation value during a cycle period of the known data sequence and then outputs the frequency offset estimation value to the NCO 544. The NCO 544 generates a complex signal corresponding to the frequency offset held by the holder 543 and outputs the generated complex signal to the multiplier 545. The multiplier 545 multiplies the complex signal outputted from the NCO 544 to the data being delayed by a set period of time in the buffer 541, thereby compensating the phase change included in the delayed data. The data having the phase change compensated by the multiplier 545 pass through the decimator 518 so as to be inputted to the equalizer 440. At this point, since the frequency offset estimated by the frequency offset estimator of the phase compensator 540 does not pass through the loop filter, the estimated frequency offset indicates the phase difference between the known data sequences. In other words, the estimated frequency offset indicates a phase offset.

Figure 9:
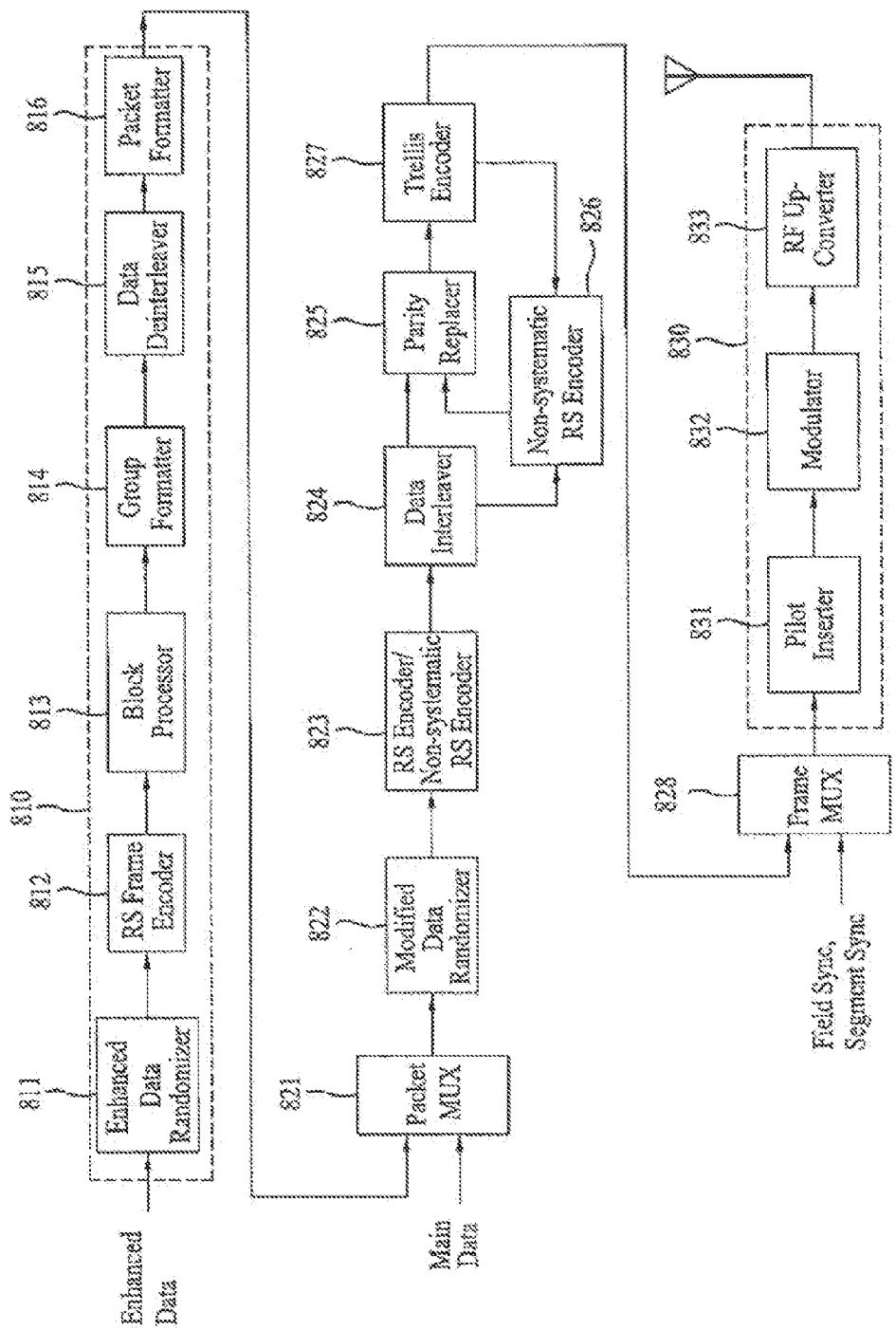
FIG. 9 illustrates a block diagram of a digital broadcast transmitting system according to another embodiment of the present invention.

FIG. 9 illustrates a block diagram showing the structure of a digital broadcast transmitting system according to an embodiment of the present invention. The digital broadcast (or DTV) transmitting system includes a pre-processor 810, a packet multiplexer 821, a data randomizer 822, a Reed-Solomon (RS) encoder/non-systematic RS encoder 823, a data interleaver 824, a parity byte replacer 825, a non-systematic RS encoder 826, a frame multiplexer 828, and a transmitting system 830. The pre-processor 810 includes an enhanced data randomizer 811, a RS frame encoder 812, a block processor 813, a group formatter 814, a data deinterleaver 815, and a packet formatter 816.

In the present invention having the above-described structure, main data are inputted to the packet multiplexer 821. Enhanced data are inputted to the enhanced data randomizer 811 of the pre-processor 810, wherein an additional coding process is performed so that the present invention can respond swiftly and appropriately against noise and change in channel. The enhanced data randomizer 811 randomizes the received enhanced data and outputs the randomized enhanced data to the RS frame encoder 812. At this point, by having the enhanced data randomizer 811 perform the randomizing process on the enhanced data, the randomizing process on the enhanced data by the data randomizer 822 in a later process may be omitted. Either the randomizer of the conventional broadcast system may be used as the randomizer for randomizing the enhanced data, or any other type of randomizer may be used herein.

The RS frame encoder 812 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame encoder 812 also includes a process of mixing in row units many sets of enhanced data each having a pre-determined size. By performing an error correction coding process on the inputted enhanced data, the RS frame encoder 812 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 812 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235,187)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 812 is inputted to the block processor 813. The block processor 813 codes the RS-coded and CRC-coded enhanced data at a coding rate of M1/N1. Then, the block processor 813 outputs the M1/N1-rate coded enhanced data to the group formatter 814. In order to do so, the block processor 813 identifies the block data bytes being inputted from the RS frame encoder 812 as bits.

The block processor 813 may receive supplemental information data such as signaling information, which include information on the system, and identifies the supplemental information data bytes as data bits. Herein, the supplemental information data, such as the signaling information, may equally pass through the enhanced data randomizer 811 and the RS frame encoder 812 so as to be inputted to the block processor 813. Alternatively, the supplemental information data may be directly inputted to the block processor 813 without passing through the enhanced data randomizer 811 and the RS frame encoder 812. The signaling information corresponds to information required for receiving and processing data included in the data group in the receiving system. Such signaling information includes data group information, multiplexing information, and burst information.

As a M1/N1-rate encoder, the block processor 813 codes the inputted data at a coding rate of M1/N1 and then outputs the M1/N1-rate coded data. For example, if 1 bit of the input data is coded to 2 bits and outputted, then M1 is equal to 1 and N1 is equal to 2 (i.e., M1=1 and N1=2). Alternatively, if 1 bit of the input data is coded to 4 bits and outputted, then M1 is equal to 1 and N1 is equal to 4 (i.e., M1=1 and N1=4). As an example of the present invention, it is assumed that the block processor 813 performs a coding process at a coding rate of ½ (also referred to as a ½-rate coding process) or a coding process at a coding rate of ¼ (also referred to as a ¼-rate coding process). More specifically, the block processor 813 codes the received enhanced data and supplemental information data, such as the signaling information, at either a coding rate of ½ or a coding rate of ¼. Thereafter, the supplemental information data, such as the signaling information, are identified and processed as enhanced data.

Since the ¼-rate coding process has a higher coding rate than the ½-rate coding process, greater error correction ability may be provided. Therefore, in a later process, by allocating the ¼-rate coded data in an area with deficient receiving performance within the group formatter 814, and by allocating the ½-rate coded data in an area with excellent receiving performance, the difference in the overall performance may be reduced. More specifically, in case of performing the ½-rate coding process, the block processor 813 receives 1 bit and codes the received 1 bit to 2 bits (i.e., 1 symbol). Then, the block processor 813 outputs the processed 2 bits (or 1 symbol). On the other hand, in case of performing the ¼-rate coding process, the block processor 813 receives 1 bit and codes the received 1 bit to 4 bits (i.e., 2 symbols). Then, the block processor 813 outputs the processed 4 bits (or 2 symbols). Additionally, the block processor 813 performs a block interleaving process in symbol units on the symbol-coded data. Subsequently, the block processor 813 converts to bytes the data symbols that are block-interleaved and have the order rearranged.

The group formatter 814 inserts the enhanced data outputted from the block processor 813 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group. At this point, the data group may be described by at least one hierarchical area. Herein, the data allocated to the each area may vary depending upon the characteristic of each hierarchical area. Additionally, each data group may be configured to include a field synchronization signal.

In another example given in the present invention, a data group is divided into A, B, and C regions in a data configuration prior to data deinterleaving.

Figure 10:
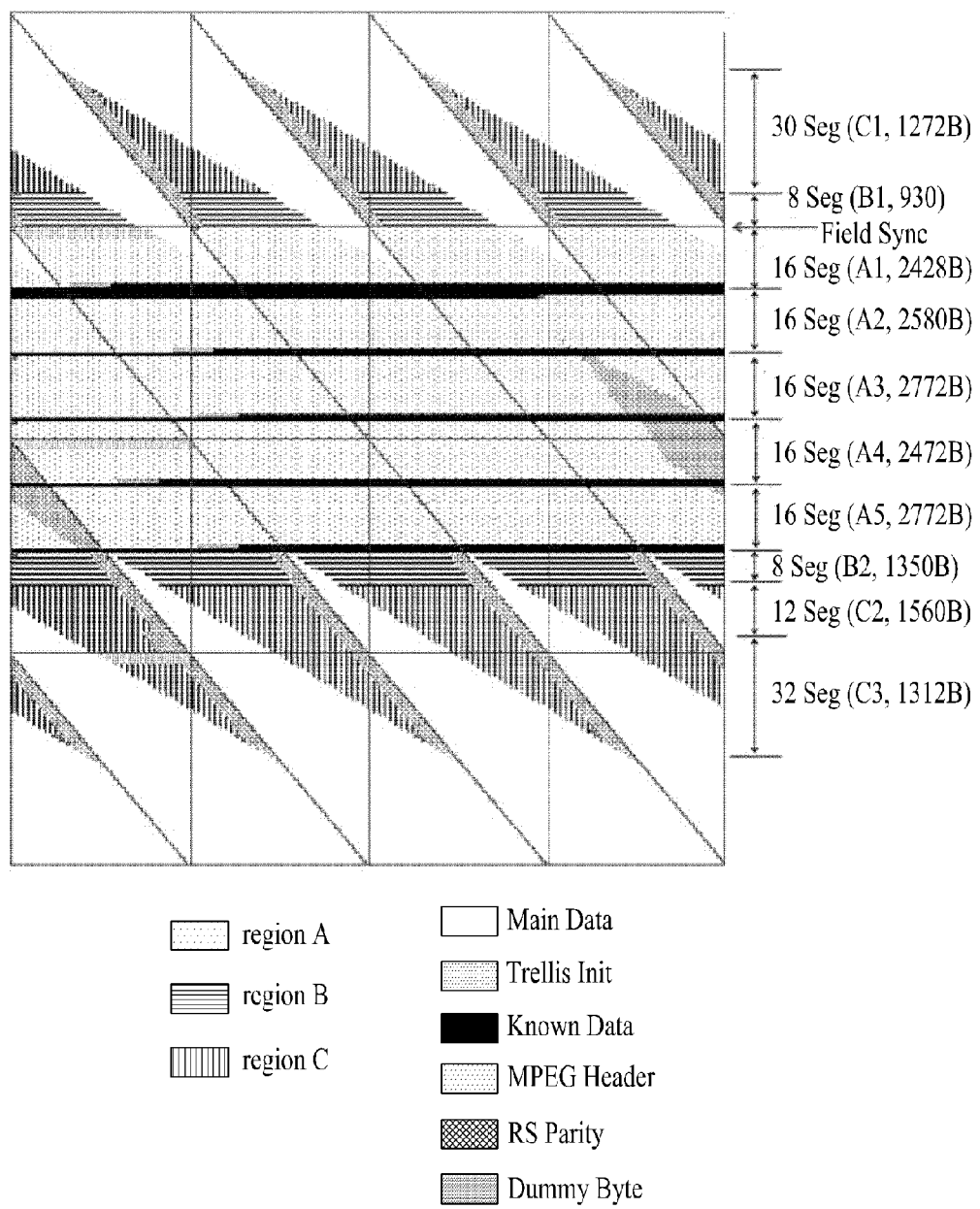
FIG. 10 and FIG. 11 illustrate another examples of data configuration at before and after ends of a data deinterleaver in a transmitting system according to the present invention.
Figure 11:
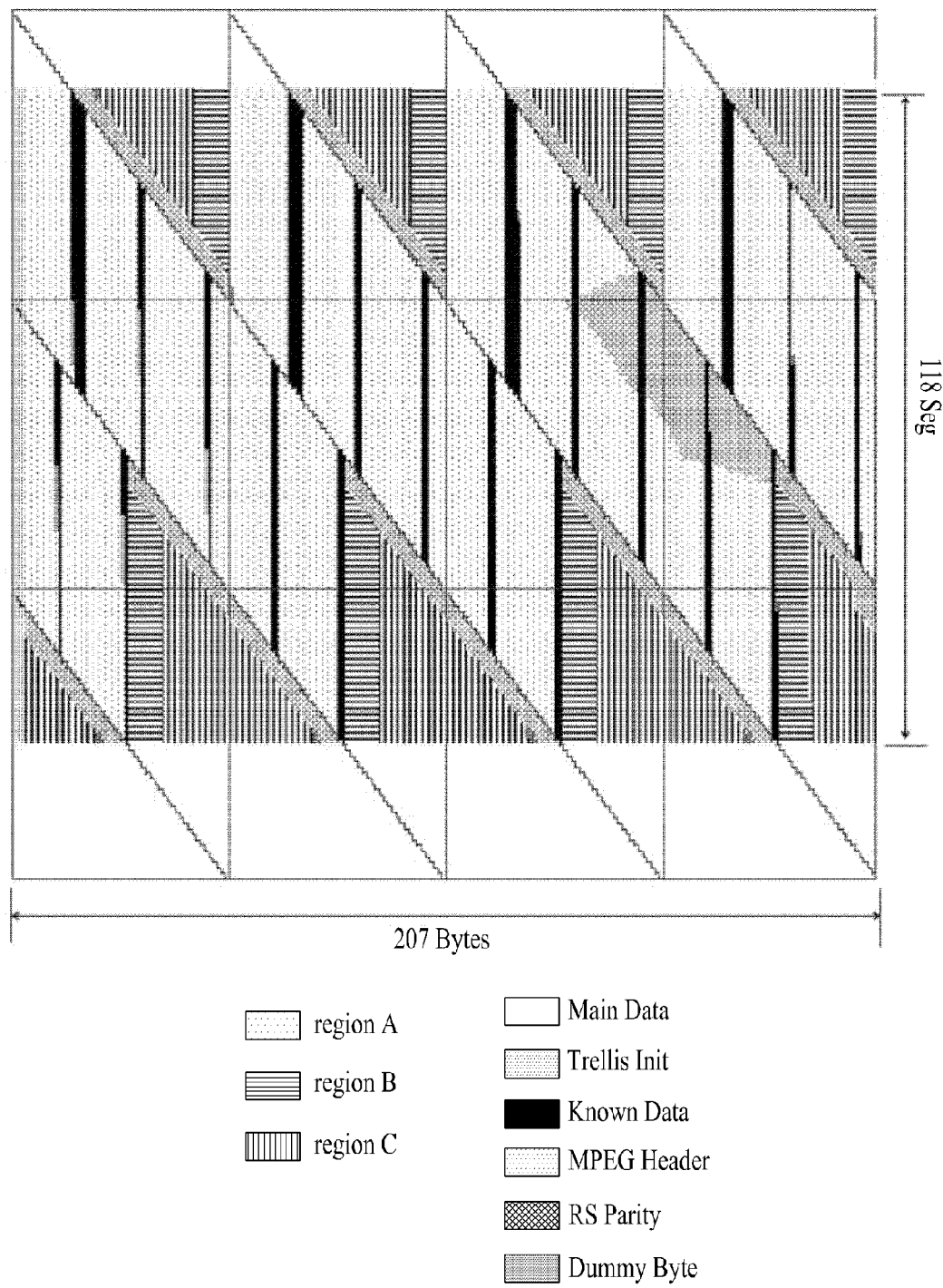

FIG. 10 illustrates an alignment of data before being data deinterleaved and identified, and FIG. 11 illustrates an alignment of data after being data deinterleaved and identified. More specifically, a data structure identical to that shown in FIG. 10 is transmitted to a receiving system. Also, the data group configured to have the same structure as the data structure shown in FIG. 10 is inputted to the data deinterleaver 815.

As described above, FIG. 10 illustrates a data structure prior to data deinterleaving that is divided into 3 regions, such as region A, region B, and region C. Also, in the present invention, each of the regions A to C is further divided into a plurality of regions. Referring to FIG. 10, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of enhanced data, which are inputted, may also vary depending upon the characteristic of each region.

In the example of the present invention, the data structure is divided into regions A to C based upon the level of interference of the main data. Herein, the data group is divided into a plurality of regions to be used for different purposes. More specifically, a region of the main data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the enhanced data, the known data having a predetermined length may be periodically inserted in the region having no interference from the main data (e.g., region A). However, due to interference from the main data, it is difficult to periodically insert known data and also to insert consecutively long known data to a region having interference from the main data (e.g., region B and region C).

Hereinafter, examples of allocating data to region A (A1 to A5), region B (B1 and B2), and region C (C1 to C3) will now be described in detail with reference to FIG. 10. The data group size, the number of hierarchically divided regions within the data group and the size of each region, and the number of enhanced data bytes that can be inserted in each hierarchically divided region of FIG. 10 are merely examples given to facilitate the understanding of the present invention. Herein, the group formatter 814 creates a data group including places in which field synchronization bytes are to be inserted, so as to create the data group that will hereinafter be described in detail.

More specifically, region A is a region within the data group in which a long known data sequence may be periodically inserted, and in which includes regions wherein the main data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 10, 2428 bytes of the enhanced data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the enhanced data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 1130 bytes of the enhanced data may be inserted in the region B1, and 1350 bytes may be inserted in region B2. Similarly, trellis initialization data or known data, MPEG header, and RS parity are not included in the enhanced data. In case of region B, the receiving system may perform equalization by using channel information obtained from the field synchronization section. Alternatively, the receiving system may also perform equalization by using channel information that may be obtained from the last known data sequence, thereby enabling the system to respond to the channel changes.

Region C includes a region located within 30 segments including and preceding the $9^{th}$ segment of the field synchronization region (chronologically located before region A) (e.g., region C1), a region located within 12 segments including and following the $9^{th}$ segment of the very last known data sequence within the data group (chronologically located after region A) (e.g., region C2), and a region located in 32 segments after the region C2 (e.g., region C3). For example, 1272 bytes of the enhanced data may be inserted in the region C1, 1560 bytes may be inserted in region C2, and 1312 bytes may be inserted in region C3. Similarly, trellis initialization data or known data, MPEG header, and RS parity are not included in the enhanced data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 813 may encode the enhanced data, which are to be inserted to each region based upon the characteristic of each hierarchical region, at a different coding rate. For example, the block processor 813 may encode the enhanced data, which are to be inserted in regions A1 to A5 of region A, at a coding rate of ½. Then, the group formatter 814 may insert the ½-rate encoded enhanced data to regions A1 to A5.

The block processor 813 may encode the enhanced data, which are to be inserted in regions B1 and B2 of region B, at a coding rate of ¼ having higher error correction ability as compared to the ½-coding rate. Then, the group formatter 814 inserts the ¼-rate coded enhanced data in region B1 and region B2. Furthermore, the block processor 813 may encode the enhanced data, which are to be inserted in regions C1 to C3 of region C, at a coding rate of ¼ or a coding rate having higher error correction ability than the ¼-coding rate. Then, the group formatter 814 may either insert the encoded enhanced data to regions C1 to C3, as described above, or leave the data in a reserved region for future usage.

In addition, the group formatter 814 also inserts supplemental data, such as signaling information that notifies the overall transmission information, other than the enhanced data in the data group. Also, apart from the encoded enhanced data outputted from the block processor 813, the group formatter 814 also inserts MPEG header place holders, non-systematic RS parity place holders, main data place holders, which are related to data deinterleaving in a later process, as shown in FIG. 10. Herein, the main data place holders are inserted because the enhanced data bytes and the main data bytes are alternately mixed with one another in regions B and C based upon the input of the data deinterleaver, as shown in FIG. 10. For example, based upon the data outputted after data deinterleaving, the place holder for the MPEG header may be allocated at the very beginning of each packet.

Furthermore, the group formatter 814 either inserts known data generated in accordance with a pre-determined method or inserts known data place holders for inserting the known data in a later process. Additionally, place holders for initializing the trellis encoder 827 are also inserted in the corresponding regions. For example, the initialization data place holders may be inserted in the beginning of the known data sequence. Herein, the size of the enhanced data that can be inserted in a data group may vary in accordance with the sizes of the trellis initialization place holders or known data (or known data place holders), MPEG header place holders, and RS parity place holders.

The output of the group formatter 814 is inputted to the data deinterleaver 815. And, the data deinterleaver 815 deinterleaves data by performing an inverse process of the data interleaver on the data and place holders within the data group, which are then outputted to the packet formatter 816. More specifically, when the data and place holders within the data group configured, as shown in FIG. 10, are deinterleaved by the data deinterleaver 815, the data group being outputted to the packet formatter 816 is configured to have the structure shown in FIG. 11.

Among the data deinterleaved and inputted, the packet formatter 816 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 814 inserts the known data place holder, the packet formatter 816 may either insert actual known data in the known data place holder or output the known data place holder without any change or modification for a replacement insertion in a later process. Afterwards, the packet formatter 816 divides the data within the above-described packet-formatted data group into 188-byte unit enhanced data packets (i.e., MPEG TS packets), which are then provided to the packet multiplexer 821. The packet multiplexer 821 multiplexes the 188-byte unit enhanced data packet and main data packet outputted from the packet formatter 816 according to a pre-defined multiplexing method. Subsequently, the multiplexed data packets are outputted to the data randomizer 822. The multiplexing method may be modified or altered in accordance with diverse variables of the system design.

As an example of the multiplexing method of the packet multiplexer 821, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 822 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 823. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 823. This is because the randomizing process has already been performed on the enhanced data by the enhanced data randomizer 811 in an earlier process. Herein, a data randomizing process may or may not be performed on the known data (or known data place holder) and the initialization data place holder included in the enhanced data packet.

The RS encoder/non-systematic RS encoder 823 RS-codes the data randomized by the data randomizer 822 or the data bypassing the data randomizer 822. Then, the RS encoder/non-systematic RS encoder 823 adds a 20-byte RS parity to the coded data, thereby outputting the RS-parity-added data to the data interleaver 824. At this point, if the inputted data correspond to the main data packet, the RS encoder/non-systematic RS encoder 823 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 824 corresponds to a byte unit convolutional interleaver. The output of the data interleaver 824 is inputted to the parity byte replacer 825 and the non-systematic RS encoder 826.

Meanwhile, a memory within the trellis encoding module 827, which is positioned after the parity byte replacer 825, should first be initialized in order to allow the output data of the trellis encoding module 827 so as to become the known data defined based upon an agreement between the receiving system and the transmitting system. More specifically, the memory of the trellis encoding module 827 should first be initialized before the known data sequence being inputted is trellis-encoded. At this point, the beginning of the known data sequence that is inputted corresponds to the initialization data place holder inserted by the group formatter 814 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 827, thereby generating the trellis memory initialization data accordingly. Due to the influence of the replace initialization data, a process of recalculating the RS parity, thereby replacing the RS parity outputted from the trellis encoding module 827 with the newly calculated RS parity is required. Accordingly, the non-systematic RS encoder 826 receives the enhanced data packet including the initialization data place holder that is to be replaced with the initialization data from the data interleaver 824 and also receives the initialization data from the trellis encoding module 827. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 825. Accordingly, the parity byte replacer 825 selects the output of the data interleaver 824 as the data within the enhanced data packet, and selects the output of the non-systematic RS encoder 826 as the RS parity. Thereafter, the parity byte replacer 825 outputs the selected data.

Meanwhile, if the main data packet is inputted, or if the enhanced data packet that does not include the initialization data place holder that is to be replaced, the parity byte replacer 825 selects the data and RS parity outputted from the data interleaver 824 and directly outputs the selected data to the trellis encoding module 827 without modification. The trellis encoding module 827 converts the byte-unit data to symbol-unit data and 12-way interleaves and trellis-encodes the converted data, which are then outputted to the frame multiplexer 828. The frame multiplexer 828 inserts field synchronization and segment synchronization signals in the output of the trellis encoding module 827 and then outputs the processed data to the transmitting unit 830. Herein, the transmitting unit 830 includes a pilot inserter 831, a modulator 832, and a radio frequency (RF) up-converter 833. The operation of the transmitting unit 830 is identical to the conventional transmitters. Therefore, a detailed description of the same will be omitted for simplicity.

Figure 12:
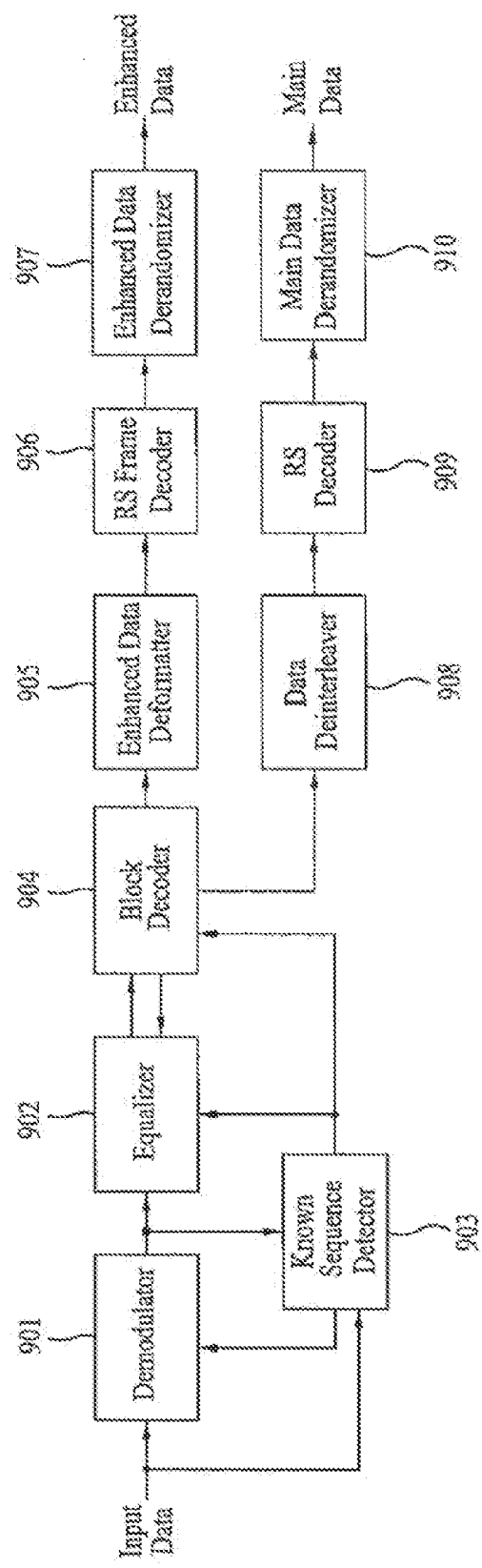
FIG. 12 illustrates a block diagram of a demodulating unit of a digital broadcast receiving system according to another embodiment of the present invention.

FIG. 12 illustrates a block diagram of a demodulating unit included in the receiving system according to another embodiment of the present invention. Herein, the demodulating unit may effectively process signals transmitted from the transmitting system shown in FIG. 9. Referring to FIG. 12, the demodulating unit includes a demodulator 901, a channel equalizer 902, a known data detector 903, a block decoder 904, an enhanced data deformatter 905, a RS frame decoder 906, an enhanced data derandomizer 907, a data deinterleaver 908, a RS decoder 909, and a main data derandomizer 910. For simplicity, the demodulator 901, the channel equalizer 902, the known data detector 903, the block decoder 904, the enhanced data deformatter 905, the RS frame decoder 906, and the enhanced data derandomizer 907 will be referred to as an enhanced data processor. And, the data deinterleaver 908, the RS decoder 909, and the main data derandomizer 910 will be referred to as a main data processor.

More specifically, the enhanced data including known data and the main data are received through the tuner and inputted to the demodulator 901 and the known data detector 903. The demodulator 901 performs automatic gain control, carrier wave recovery, and timing recovery on the data that are being inputted, thereby creating baseband data, which are then outputted to the equalizer 902 and the known data detector 903. The equalizer 902 compensates the distortion within the channel included in the demodulated data. Then, the equalizer 902 outputs the compensated data to the block decoder 904.

At this point, the known data detector 903 detects the known data place inserted by the transmitting system to the input/output data of the demodulator 901 (i.e., data prior to demodulation or data after demodulation). Then, along with the position information, the known data detector 903 outputs the symbol sequence of the known data generated from the corresponding position to the demodulator 901 and the equalizer 902. Additionally, the known data detector 903 outputs information enabling the block decoder 904 to identify the enhanced data being additionally encoded by the transmitting system and the main data that are not additionally encoded to the block decoder 904. Furthermore, although the connection is not shown in FIG. 12, the information detected by the known data detector 903 may be used in the overall receiving system and may also be used in the enhanced data formatter 905 and the RS frame decoder 906.

By using the known data symbol sequence when performing the timing recovery or carrier wave recovery, the demodulating performance of the demodulator 901 may be enhanced. Similarly, by using the known data, the channel equalizing performance of the channel equalizer 902 may be enhanced. Furthermore, by feeding-back the decoding result of the block decoder 904 to the channel equalizer 902, the channel equalizing performance may also be enhanced.

The channel equalizer 902 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 10. More specifically, in the example of the present invention, each region A, B, and C are further divided into regions A1 to A5, regions B1 and B2, and regions C1 to C3, respectively. Referring to FIG. 10, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being channel equalized and then inputted to the block decoder 904 correspond to the enhanced data on which additional encoding and trellis encoding are both performed by the transmitting system, trellis-decoding and additional decoding processes are performed as inverse processes of the transmitting system. Alternatively, if the data being channel equalized and then inputted to the block decoder 904 correspond to the main data on which additional encoding is not performed and only trellis-encoding is performed by the transmitting system, only the trellis-decoding process is performed. The data group decoded by the block decoder 904 is inputted to the enhanced data deformatter 905, and the main data packet is inputted to the data deinterleaver 908.

More specifically, if the inputted data correspond to the main data, the block decoder 904 performs Viterbi decoding on the inputted data, so as to either output a hard decision value or hard-decide a soft decision value and output the hard-decided result. On the other hand, if the inputted correspond to the enhanced data, the block decoder 904 outputs either a hard decision value or a soft decision value on the inputted enhanced data. In other words, if the data inputted to the block decoder 904 correspond to the enhanced data, the block decoder 904 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 904 may output a hard decision value on the enhanced data. However, when required, it is more preferable that the block decoder 904 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 908, the RS decoder 909, and the main data derandomizer 910 are blocks required for receiving the main data. These blocks may not be required in a receiving system structure that receives only the enhanced data. The data deinterleaver 908 performs an inverse process of the data interleaver of the transmitting system. More specifically, the data deinterleaver 908 deinterleaves the main data being outputted from the block decode 904 and outputs the deinterleaved data to the RS decoder 909. The RS decoder 909 performs systematic RS decoding on the deinterleaved data and outputs the systematically decoded data to the main data derandomizer 910. The main data derandomizer 910 receives the data outputted from the RS decoder 909 so as to generate the same pseudo random byte as that of the randomizer in the transmitting system. The main data derandomizer 910 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 905 from the block decoder 904 is a data group format. At this point, the enhanced data deformatter 905 already knows the structure of the input data. Therefore, the enhanced data deformatter 905 identifies the system information including signaling information and the enhanced data from the data group. Thereafter, the identified signaling information is transmitted to where the system information is required, and the enhanced data are outputted to the RS frame decoder 906. The enhanced data deformatter 905 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 906.

More specifically, the RS frame decoder 906 receives the RS-coded and CRC-coded enhanced data from the enhanced data deformatter 905 so as to configure the RS frame. The RS frame decoder 906 performs an inverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 907. Herein, the enhanced data derandomizer 907 performs a derandomizing process, which corresponds to an inverse process of the enhanced data randomizer included in the transmitting system, on the received enhanced data. Then, by outputting the processed data, the enhanced data transmitted from the transmitting system can be obtained.

According to an embodiment of the present invention, the RS frame decoder 906 may also be configured as follows. The RS frame decoder 906 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 906 compares the absolute value of the soft decision value obtained from the block decoder 904 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 13:
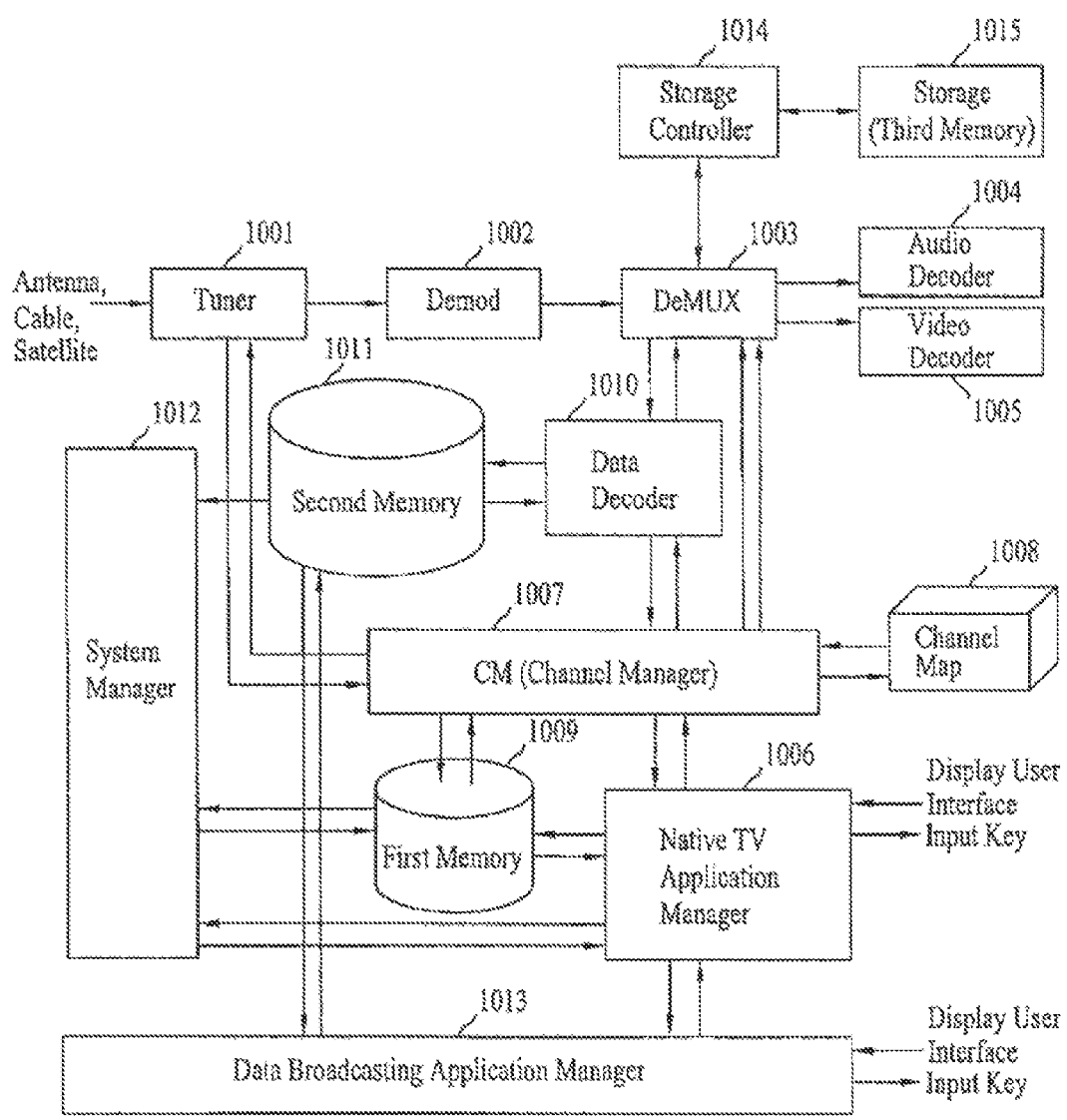
FIG. 13 illustrates a block diagram of a digital broadcast receiving system according to an embodiment of the present invention.

FIG. 13 illustrates a block diagram showing the structure of a digital broadcast receiving system according to an embodiment of the present invention. Referring to FIG. 13, the digital broadcast receiving system includes a tuner 1001, a demodulating unit 1002, a demultiplexer 1003, an audio decoder 1004, a video decoder 1005, a native TV application manager 1006, a channel manager 1007, a channel map 1008, a first memory 1009, a data decoder 1010, a second memory 1011, a system manager 1012, a data broadcasting application manager 1013, a storage controller 1014, and a third memory 1015. Herein, the third memory 1015 is a mass storage device, such as a hard disk drive (HDD) or a memory chip. The tuner 1001 tunes a frequency of a specific channel through any one of an antenna, cable, and satellite. Then, the tuner 1001 downconverts the tuned frequency to an intermediate frequency (IF), which is then outputted to the demodulating unit 1002. At this point, the tuner 1001 is controlled by the channel manager 1007. Additionally, the result and strength of the broadcast signal of the tuned channel are also reported to the channel manager 1007. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 1002 performs demodulation and channel equalization on the signal being outputted from the tuner 1001, thereby identifying the main data and the enhanced data. Thereafter, the identified main data and enhanced data are outputted in TS packet units. Examples of the demodulating unit 1002 are shown in FIG. 4 and FIG. 12. The demodulating unit shown in FIG. 4 and FIG. 12 is merely exemplary and the scope of the present invention is not limited to the examples set forth herein. In the embodiment given as an example of the present invention, only the enhanced data packet outputted from the demodulating unit 1002 is inputted to the demultiplexer 1003. In this case, the main data packet is inputted to another demultiplexer (not shown) that processes main data packets. Herein, the storage controller 1014 is also connected to the other demultiplexer in order to store the main data after processing the main data packets. The demultiplexer of the present invention may also be designed to process both enhanced data packets and main data packets in a single demultiplexer.

The storage controller 1014 is interfaced with the demultipelxer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 13, the corresponding enhanced data and/or main data that are inputted to the demultiplexer are stored in the third memory 1015 in accordance with the control of the storage controller 1014. The third memory 1015 may be described as a temporary storage area and/or a permanent storage area. Herein, the temporary storage area is used for the time shifting function, and the permanent storage area is used for a permanent storage of data according to the user's choice (or decision).

When the data stored in the third memory 1015 need to be reproduced (or played), the storage controller 1014 reads the corresponding data stored in the third memory 1015 and outputs the read data to the corresponding demultiplexer (e.g., the enhanced data are outputted to the demultiplexer 1003 shown in FIG. 13). At this point, according to the embodiment of the present invention, since the storage capacity of the third memory 1015 is limited, the compression encoded enhanced data and/or main data that are being inputted are directly stored in the third memory 1015 without any modification for the efficiency of the storage capacity. In this case, depending upon the reproduction (or reading) command, the data read from the third memory 1015 pass trough the demultiplexer so as to be inputted to the corresponding decoder, thereby being restored to the initial state.

The storage controller 1014 may control the reproduction (or play), fast-forward, rewind, slow motion, instant replay functions of the data that are already stored in the third memory 1015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 1014 compression encodes the inputted data and stored the compression-encoded data to the third memory 1015. In order to do so, the storage controller 1014 may include an encoder, wherein the encoder may be embodied as one of software, middleware, and hardware. Herein, an MPEG encoder may be used as the encoder according to an embodiment of the present invention. The encoder may also be provided outside of the storage controller 1014.

Meanwhile, in order to prevent illegal duplication (or copies) of the input data being stored in the third memory 1015, the storage controller 1014 scrambles the input data and stores the scrambled data in the third memory 1015. Accordingly, the storage controller 1014 may include a scramble algorithm for scrambling the data stored in the third memory 1015 and a descramble algorithm for descrambling the data read from the third memory 1015. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 1003 receives the real-time data outputted from the demodulating unit 1002 or the data read from the third memory 1015 and demultiplexes the received data. In the example given in the present invention, the demultiplexer 1003 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 1003 and the subsequent elements.

The demultiplexer 1003 demultiplexes enhanced data and program specific information/program and system information protocol (PSI/PSIP) tables from the enhanced data packet inputted in accordance with the control of the data decoder 1010. Thereafter, the demultiplexed enhanced data and PSI/PSIP tables are outputted to the data decoder 1010 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 1010, the demultiplexer 1003 performs section filtering, thereby discarding repetitive sections and outputting only the non-repetitive sections to the data decoder 1010. The demultiplexer 1003 may also output only the sections configuring desired tables (e.g., VCT) to the data decoder 1010 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 1003 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 1003 may output only an application information table (AIT) to the data decoder 1010 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 1011 by the data decoder 1010.

The data decoder 1010 parses the DSM-CC section configuring the demultiplexed enhanced data. Then, the enhanced data corresponding to the parsed result are stored as a database in the second memory 1011. The data decoder 1010 groups a plurality of sections having the same table identification (table_id) so as to configure a table, which is then parsed. Thereafter, the parsed result is stored as a database in the second memory 1011. At this point, by parsing data and/or sections, the data decoder 1010 reads all of the remaining actual section data that are not section-filtered by the demultiplexer 1003. Then, the data decoder 1010 stores the read data to the second memory 1011. The second memory 1011 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 1011 or be outputted to the data broadcasting application manager 1013. In addition, reference may be made to the application identification information, service component identification information, and service information in order to decode the data service data. Alternatively, such information may also prepare the operation of the application program for the data service. Furthermore, the data decoder 1010 controls the demultiplexing of the system information table, which corresponds to the information table associated with the channel and events. Thereafter, an A.V PID list may be transmitted to the channel manager 1007.

The channel manager 1007 may refer to the channel map 1008 in order to transmit a request for receiving system-related information data to the data decoder 1010, thereby receiving the corresponding result. In addition, the channel manager 1007 may also control the channel tuning of the tuner 1001. Furthermore, the channel manager 1007 may directly control the demultiplexer 1003, so as to set up the A/V PID, thereby controlling the audio decoder 1004 and the video decoder 1005. The audio decoder 1004 and the video decoder 1005 may respectively decode and output the audio data and video data demultiplexed from the main data packet. Alternatively, the audio decoder 1004 and the video decoder 1005 may respectively decode and output the audio data and video data demultiplexed from the enhanced data packet. Meanwhile, when the enhanced data include data service data, and also audio data and video data, it is apparent that the audio data and video data demultiplexed by the demultiplexer 1003 are respectively decoded by the audio decoder 1004 and the video decoder 1005. For example, an audio-coding (AC)-3 decoding algorithm may be applied to the audio decoder 1004, and a MPEG-2 decoding algorithm may be applied to the video decoder 1005.

Meanwhile, the native TV application manager 1006 operates a native application program stored in the first memory 1009, thereby performing general functions such as channel change. The native application program refers to software stored in the receiving system upon shipping of the product. More specifically, when a user request (or command) is transmitted to the receiving system through a user interface (UI), the native TV application manger 1006 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 1006 and the data broadcasting application manager 1013. Furthermore, the native TV application manager 1006 controls the channel manager 1007, thereby controlling channel-associated, such as the management of the channel map 1008, and controlling the data decoder 1010. The native TV application manager 1006 also controls the GUI of the overall receiving system, thereby storing the user request and status of the receiving system in the first memory 1009 and restoring the stored information.

The channel manager 1007 controls the tuner 1001 and the data decoder 1010, so as to managing the channel map 1008 so that it can respond to the channel request made by the user. More specifically, channel manager 1007 sends a request to the data decoder 1010 so that the tables associated with the channels that are to be tuned are parsed. The results of the parsed tables are reported to the channel manager 1007 by the data decoder 1010. Thereafter, based on the parsed results, the channel manager 1007 updates the channel map 1008 and sets up a PID in the demultiplexer 1003 for demultiplexing the tables associated with the data service data from the enhanced data.

The system manager 1012 controls the booting of the receiving system by turning the power on or off. Then, the system manager 1012 stores ROM images (including downloaded software images) in the first memory 1009. More specifically, the first memory 1009 stores management programs such as operating system (OS) programs required for managing the receiving system and also application program executing data service functions. The application program is a program processing the data service data stored in the second memory 1011 so as to provide the user with the data service. If the data service data are stored in the second memory 1011, the corresponding data service data are processed by the above-described application program or by other application programs, thereby being provided to the user. The management program and application program stored in the first memory 1009 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 1009 upon the shipping of the receiving system, or be stored in the first 1009 after being downloaded. The application program for the data service (i.e., the data service providing application program) stored in the first memory 1009 may also be deleted, updated, and corrected. Furthermore, the data service providing application program may be downloaded and executed along with the data service data each time the data service data are being received.

When a data service request is transmitted through the user interface, the data broadcasting application manager 1013 operates the corresponding application program stored in the first memory 1009 so as to process the requested data, thereby providing the user with the requested data service. And, in order to provide such data service, the data broadcasting application manager 1013 supports the graphic user interface (GUI). Herein, the data service may be provided in the form of text (or short message service (SMS)), voice message, still image, and moving image. The data broadcasting application manager 1013 may be provided with a platform for executing the application program stored in the first memory 1009. The platform may be, for example, a Java virtual machine for executing the Java program. Hereinafter, an example of the data broadcasting application manager 1013 executing the data service providing application program stored in the first memory 1009, so as to process the data service data stored in the second memory 1011, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 13, the GPS module receives satellite signals transmitted from a plurality of low earth orbit satellites and extracts the current position (or location) information (e.g., longitude, latitude, altitude), thereby outputting the extracted information to the data broadcasting application manager 1013.

At this point, it is assumed that the electronic map including information on each link and nod and other diverse graphic information are stored in one of the second memory 1011, the first memory 1009, and another memory that is not shown. More specifically, according to the request made by the data broadcasting application manager 1013, the data service data stored in the second memory 1011 are read and inputted to the data broadcasting application manager 1013. The data broadcasting application manager 1013 translates (or deciphers) the data service data read from the second memory 1011, thereby extracting the necessary information according to the contents of the message and/or a control signal.

Figure 14:
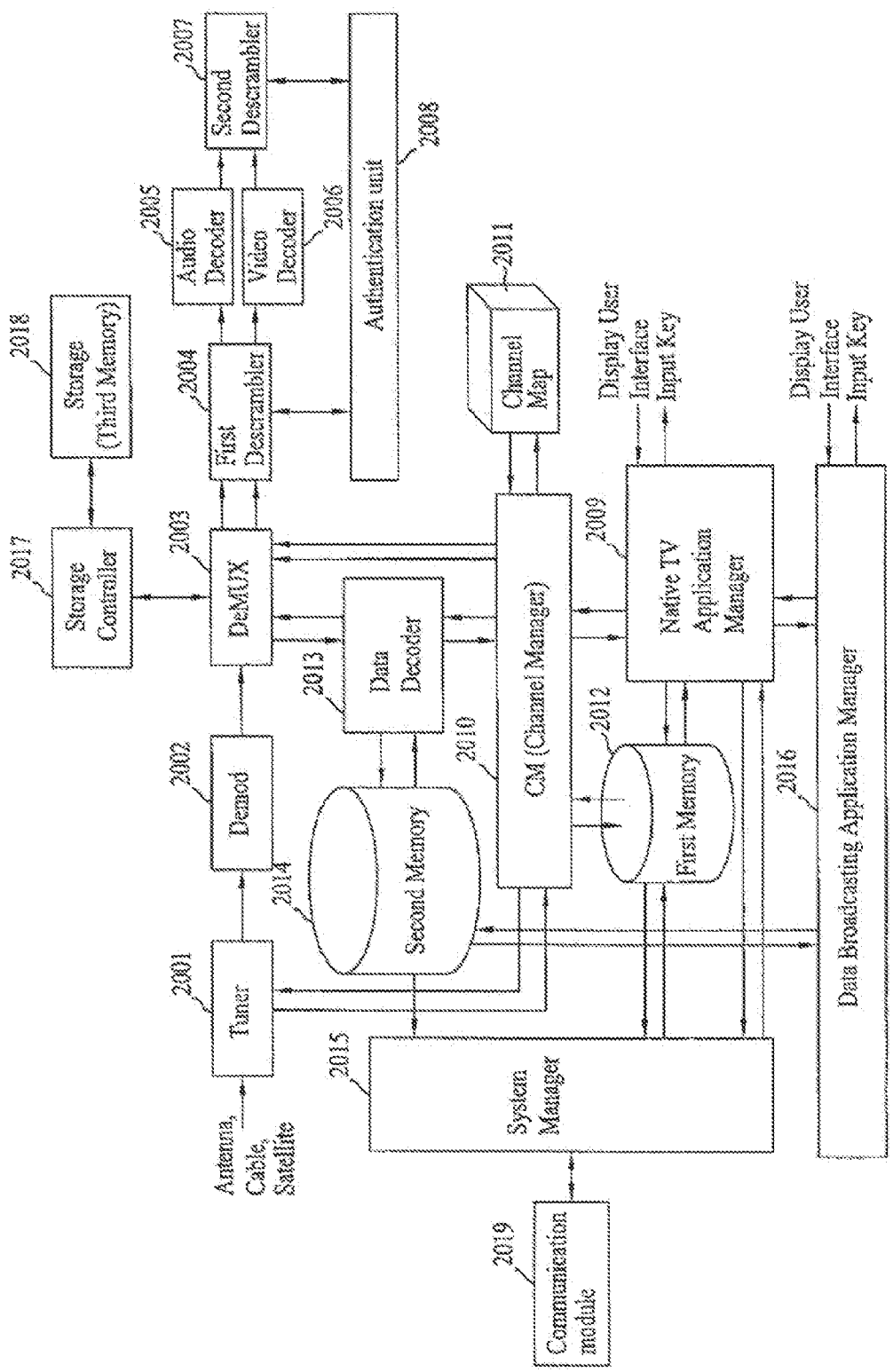
FIG. 14 illustrates a block diagram of a digital broadcast receiving system according to another embodiment of the present invention.

FIG. 14 illustrates a block diagram showing the structure of a digital broadcast (or television) receiving system according to another embodiment of the present invention. Referring to FIG. 14, the digital broadcast receiving system includes a tuner 2001, a demodulating unit 2002, a demultiplexer 2003, a first descrambler 2004, an audio decoder 2005, a video decoder 2006, a second descrambler 2007, an authentication unit 2008, a native TV application manager 2009, a channel manager 2010, a channel map 2011, a first memory 2012, a data decoder 2013, a second memory 2014, a system manager 2015, a data broadcasting application manager 2016, a storage controller 2017, a third memory 2018, and a telecommunication module 2019. Herein, the third memory 2018 is a mass storage device, such as a hard disk drive (HDD) or a memory chip. Also, during the description of the digital broadcast (or television or DTV) receiving system shown in FIG. 14, the components that are identical to those of the digital broadcast receiving system of FIG. 13 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 2004 and 2007, and the authentication means will be referred to as an authentication unit 2008. Such naming of the corresponding components is merely exemplary and is not limited to the terms suggested in the description of the present invention. For example, the units may also be referred to as a decryptor. Although FIG. 14 illustrates an example of the descramblers 2004 and 2007 and the authentication unit 2008 being provided inside the receiving system, each of the descramblers 2004 and 2007 and the authentication unit 2008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 2008, the scrambled broadcasting contents are descrambled by the descramblers 2004 and 2007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 2008 and the descramblers 2004 and 2007 will now be described in detail. The receiving system receives the scrambled broadcasting contents through the tuner 2001 and the demodulating unit 2002. Then, the system manager 2015 decides whether the received broadcasting contents have been scrambled. Herein, the demodulating unit 2002 may be included as a demodulating means according to embodiments of the present invention as described in FIG. 4 and FIG. 12. However, the present invention is not limited to the examples given in the description set forth herein. If the system manager 2015 decides that the received broadcasting contents have been scrambled, then the system manager 2015 controls the system to operate the authentication unit 2008. As described above, the authentication unit 2008 performs an authentication process in order to decide whether the receiving system according to the present invention corresponds to a legitimate host entitled to receive the paid broadcasting service. Herein, the authentication process may vary in accordance with the authentication methods.

For example, the authentication unit 2008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 2008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 2008 performs the authentication process by determining the conformity between the address of the corresponding receiving system and the system information of the receiving system that is mapped with the IP address. In other words, if the authentication unit 2008 determines that the two types of information conform to one another, then the authentication unit 2008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 2008 of the receiving system extracts the identification information of the receiving system and the identification information included in the EMM of the broadcasting service that is being received. Then, the authentication unit 2008 determines whether the identification information conform to each other, so as to perform the authentication process. More specifically, if the authentication unit 2008 determines that the information conform to each other, then the authentication unit 2008 eventually determines that the receiving system is entitled to receive the request broadcasting service.

In yet another example, the authentication unit 2008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 2015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 2015 transmits the payment information to the remote transmitting system through the telecommunication module 2019.

The authentication unit 2008 authenticates the corresponding receiving system and/or the external module. Then, if the authentication process is successfully completed, the authentication unit 2008 certifies the corresponding receiving system and/or the external module as a legitimate system and/or module entitled to receive the requested paid broadcasting service. In addition, the authentication unit 2008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 2008, the receiving system may descramble the scrambled broadcasting contents received from the transmitting system. At this point, the descrambling process is performed by the first and second descramblers 2004 and 2007. Herein, the first and second descramblers 2004 and 2007 may be included in an internal module or an external module of the receiving system.

The receiving system is also provided with a common interface for communicating with the external module including the first and second descramblers 2004 and 2007, so as to perform the descrambling process. More specifically, the first and second descramblers 2004 and 2007 may be included in the module or in the receiving system in the form of hardware, middleware or software. Herein, the descramblers 2004 and 2007 may be included in any one of or both of the module and the receiving system. If the first and second descramblers 2004 and 2007 are provided inside the receiving system, it is advantageous to have the transmitting system (i.e., at least any one of a service provider and a broadcast station) scramble the corresponding data using the same scrambling method.

Alternatively, if the first and second descramblers 2004 and 2007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 2015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 2012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 2008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 2008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 2015, then the memory card is verified and determined to be a normal memory card that may be used in the receiving system. At this point, the CAS software may either be installed in the first memory 2012 upon the shipping of the present invention, or be downloaded to the first memory 2012 from the transmitting system or the module or memory card, as described above. Herein, the descrambling function may be operated by the data broadcasting application manger 2016 as an application program.

Thereafter, the CAS software parses the EMM/ECM packets outputted from the demultiplexer 2003, so as to verify whether the receiving system is entitled to receive the corresponding data, thereby obtaining the information required for descrambling (i.e., the CW) and providing the obtained CW to the descramblers 2004 and 2007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 2004 and 2007. Each of the descramblers 2004 and 2007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 2004 and 2007 may be included in the module either in the form of hardware or in the form of software. In this case, the scrambled data that being received are descrambled by the module and then demodulated. Also, if the scrambled data that are being received are stored in the third memory 2018, the received data may be descrambled and then stored, or stored in the memory at the point of being received and then descrambled later on prior to being played (or reproduced). Thereafter, in case scramble/descramble algorithms are provided in the storage controller 2017, the storage controller 2017 scrambles the data that are being received once again and then stores the re-scrambled data to the third memory 2018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 2019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 2019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 2019 may also be configured. Also, the PDU may be configured in the Java application of the receiving system and then outputted to the telecommunication module 2019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 2019.

The broadcasting data being transmitted and received through the above-described wireless data network may include data required for performing the function of limiting data reception. Meanwhile, the demultiplexer 2003 receives either the real-time data outputted from the demodulating unit 2002 or the data read from the third memory 2018, thereby performing demultiplexing. In this embodiment of the present invention, the demultiplexer 2003 performs demultiplexing on the enhanced data packet. Similar process steps have already been described earlier in the description of the present invention. Therefore, a detailed of the process of demultiplexing the enhanced data will be omitted for simplicity.

The first descrambler 2004 receives the demultiplexed signals from the demultiplexer 2003 and then descrambles the received signals. At this point, the first descrambler 2004 may receive the authentication result received from the authentication unit 2008 and other data required for the descrambling process, so as to perform the descrambling process. The audio decoder 2005 and the video decoder 2006 receive the signals descrambled by the first descrambler 2004, which are then decoded and outputted. Alternatively, if the first descrambler 2004 did not perform the descrambling process, then the audio decoder 2005 and the video decoder 2006 directly decode and output the received signals. In this case, the decoded signals are received and then descrambled by the second descrambler 2007 and processed accordingly.

As described above, the DTV receiving system and methods of processing DTV signals according to the present invention have the following advantages. More specifically, the DTV receiving system and method of processing DTV signal according to the present invention is highly protected against (or resistant to) any error that may occur when transmitting supplemental data through a channel. And, the present invention is also highly compatible to the conventional receiving system. Moreover, the present invention may also receive the supplemental data without any error even in channels having severe ghost effect and noise.

Additionally, by having the transmitting system periodically or non-periodically transmit known data having a pattern pre-decided in accordance with an agreement between the transmitting system and the receiving system, and by having the receiving system use the known data for performing carrier recovery and timing recovery, and for compensating a phase change between repeating known data sequences, the receiving performance of the receiving system may be enhanced in a situation undergoing severe and frequent channel changes. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing broadcast data in a broadcast transmitting system, the method comprising:
    Reed-Solomon (RS) encoding and cyclic redundancy check (CRC) encoding enhanced data bytes;
    converting the RS-CRC encoded enhanced data bytes into enhanced data bits;
    encoding each of the converted enhanced data bits with one of a first coding rate and a second coding rate, thereby outputting data symbols;
    first interleaving the data symbols;
    converting the first interleaved data symbols into data bytes;
    forming a first data group including enhanced data corresponding to the converted data bytes, wherein the first data group comprises regions A, B and C, wherein the region A is central, the region B is concentric about the region A, and the region C is concentric about the regions A and B, wherein the region A includes enhanced data encoded with the first coding rate and known data sequences, and wherein the regions B and C include enhanced data encoded with the second coding rate, but do not include known data sequences;
    deinterleaving data of the first data group;
    outputting enhanced data packets including the deinterleaved data of the first data group;
    multiplexing the enhanced data packets with main data packets including main data;
    second interleaving data of the multiplexed data packets; and
    trellis encoding the second interleaved data.

2. The method of claim 1, further comprising RS encoding data of the multiplexed data packets and inserting RS parity data into the multiplexed data packets.

3. The method of claim 1, wherein the first coding rate is different from the second coding rate.

4. The method of claim 1, wherein the first coding rate is equal to the second coding rate.

5. The method of claim 1, wherein the first code rate is either ½ or ¼ and the second code rate is one of either ½ or ¼.

6. A broadcast transmitting system comprising:
    a Reed-Solomon (RS) frame encoder for RS encoding and cyclic redundancy check (CRC) encoding enhanced data bytes;
    a block processor for converting the RS-CRC encoded enhanced data bytes into enhanced data bits, encoding each of the converted enhanced data bits with one of a first coding rate and a second coding rate and outputting data symbols, first interleaving the data symbols, and converting the first interleaved data symbols into data bytes;
    a group formatting unit for forming a first data group including enhanced data corresponding to the converted data bytes, wherein the first data group comprises regions A, B and C, wherein the region A is central, the region B is concentric about the region A, and the region C is concentric about the regions A and B, wherein the region A includes enhanced data encoded with the first coding rate and known data sequences, and wherein the regions B and C include enhanced data encoded with the second coding rate, but do not include known data sequences;
    a deinterleaver for deinterleaving data of the first data group;
    a packet formatter for outputting enhanced data packets including the deinterleaved data of the first data group;
    a multiplexer for multiplexing the enhanced data packets with main data packets including main data;
    an interleaver for second interleaving data of the multiplexed data packets; and a trellis encoding unit for trellis encoding the second interleaved data.

7. The broadcast transmitting system of claim 6, further comprising an RS encoder for RS encoding data of the multiplexed data packets and inserting RS parity data into the multiplexed data packets.

8. The broadcast transmitting system of claim 6, wherein the first coding rate is different from the second coding rate.

9. The broadcast transmitting system of claim 6, wherein the first coding rate is equal to the second coding rate.

10. The broadcast transmitting system of claim 6, wherein the first code rate is either ½ or ¼ and the second code rate is one of either ½ or ¼.

* * * * *